(12) United States Patent
Dutta et al.

(10) Patent No.: US 12,438,039 B2
(45) Date of Patent: Oct. 7, 2025

(54) AIR GAP IN BEOL INTERCONNECT

(71) Applicant: INTERNATIONAL BUSINESS MACHINES CORPORATION, Armonk, NY (US)

(72) Inventors: Ashim Dutta, Clifton Park, NY (US); Son Nguyen, Schenectady, NY (US); Matthew T. Shoudy, Guilderland, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 417 days.

(21) Appl. No.: 18/185,481

(22) Filed: Mar. 17, 2023

(65) Prior Publication Data

US 2024/0312834 A1 Sep. 19, 2024

(51) Int. Cl.
*H01L 21/768* (2006.01)
*H01L 23/532* (2006.01)

(52) U.S. Cl.
CPC .... *H01L 21/7682* (2013.01); *H01L 21/76843* (2013.01); *H01L 23/53238* (2013.01); *H01L 23/53266* (2013.01); *H01L 23/5329* (2013.01)

(58) Field of Classification Search
None
See application file for complete search history.

(56) References Cited

U.S. PATENT DOCUMENTS

| | | | |
|---|---|---|---|
| 7,928,003 B2 | 4/2011 | Naik | |
| 9,041,217 B1 * | 5/2015 | Bristol | H01L 21/76816 257/774 |
| 9,449,871 B1 | 9/2016 | Bergendahl | |
| 9,613,851 B2 | 4/2017 | Nitta | |

(Continued)

FOREIGN PATENT DOCUMENTS

| | | | | |
|---|---|---|---|---|
| CN | 110556335 A | * | 12/2019 | ....... H01L 21/76877 |
| CN | 113540032 A | * | 10/2021 | ........... H01L 23/528 |
| WO | WO-2018118088 A1 | * | 6/2018 | ....... H01L 21/76825 |

OTHER PUBLICATIONS

Chen et al., "Fully Self-Aligned Via Integration for Interconnect Scaling Beyond 3nm Node", 2021 IEEE, IEDM21, pp. 22.1.1-22.1.4.

(Continued)

*Primary Examiner* — Michael Lebentritt
(74) *Attorney, Agent, or Firm* — Steven M. Bouknight

(57) ABSTRACT

A first BEOL layer, including a first and a second signal line, a conformal dielectric surrounding an upper portion of a vertical sidewall of each of the first signal line and the second signal line, an air gap between the first and the second signal line, a vertical side boundary of the air gap is a vertical side surface of the first signal line. Forming a first and a second metal line in a sacrificial material in a first BEOL layer, removing the sacrificial material, forming a conformal dielectric surrounding vertical side surfaces of the first and the second metal line, an air gap between the first and the second metal line exposes an upper horizontal surface of a dielectric layer below the first BEOL layer, (Continued)

growing a dielectric selectively from an upper portion of the conformal dielectric, the air gap remains between the first and the second metal line.

20 Claims, 18 Drawing Sheets

(56) References Cited

U.S. PATENT DOCUMENTS

| | | | |
|---|---|---|---|
| 9,859,151 | B1 | 1/2018 | Zhu |
| 10,665,499 | B2 | 5/2020 | Reshotko |
| 10,727,114 | B2 | 7/2020 | Bruce |
| 11,430,690 | B2 | 8/2022 | Cheng |
| 2009/0239375 | A1* | 9/2009 | Riess ............... H01L 21/76808 438/689 |
| 2011/0193230 | A1* | 8/2011 | Nogami ............ H01L 21/7682 257/E21.585 |
| 2016/0118341 | A1* | 4/2016 | Wei .................. H01L 21/76808 257/776 |
| 2017/0317025 | A1 | 11/2017 | Briggs |
| 2019/0279896 | A1* | 9/2019 | Singh ................ H01L 23/481 |
| 2022/0102192 | A1* | 3/2022 | Su .................... H01L 21/76895 |
| 2022/0350262 | A1* | 11/2022 | Yang ................ H01L 21/76897 |
| 2023/0197607 | A1* | 6/2023 | Xie ................... H01L 23/5226 257/774 |
| 2023/0360964 | A1* | 11/2023 | Zhu .................. H01L 21/76832 |
| 2024/0321630 | A1* | 9/2024 | Xie .................. H01L 21/76897 |

OTHER PUBLICATIONS

Nguyen et al., "Advanced ultrathin nano layers selective Cobalt and conformal SiN conformal caps for sub-20 nm Copper/Low k interconnects", ALD AMAT 2013, 3 pages.

Nguyen et al., "Selective deposition of AlOx for Fully Aligned via in nano Cu interconnects", 2021 IEEE International Interconnect Technology Conference(IITC), Jul. 6-9, 2021 Online, pp. 1-2.

Pattison et al., "Surface Initiated Polymer Thin Films for the Area Selective Deposition and Etching of Metal Oxides", ACSNano. Apr. 28, 2020;14(4):4276-4288. doi: 10.1021/acsnano.9b09637. Epub Mar. 18, 2020, 1 page.

Priyadarshini et al., "Advanced Metal and Dielectric Barrier Cap Film for Cu Low k Interconnects", Conference Paper May 2014, 4 pages.

* cited by examiner

AIR GAP IN BEOL INTERCONNECT

BACKGROUND

The present invention relates, generally, to the field of semiconductor manufacturing, and more particularly to fabricating back end of line (BEOL) interconnect structure with an air gap.

Back-end-of-the-line (BEOL) processing of semiconductor technologies (such as CMOS technologies) includes forming an interlayer dielectric on active circuitry, forming backside metal lines in the interlayer dielectric, forming vias connecting the backside metal lines to the active circuitry, forming a backside power delivery network and forming vias connecting the backside metal line and the active circuitry to the backside power delivery network. As scaling of interconnects, such as metal lines and vias, are reduced, reducing capacitance is important to reduce an RC (resistive capacitive) delay between adjacent metal lines and vias.

SUMMARY

According to an embodiment, a semiconductor device is provided. The semiconductor device including a first back end of line (BEOL) layer, the first BEOL layer including a first signal line and a second signal line, and a conformal dielectric surrounding vertical sidewalls of each of the first signal line and the second signal line, an air gap between the first signal line and the second signal line, where a vertical side boundary of the air gap is a vertical side surface of the conformal dielectric.

According to an embodiment, a semiconductor device is provided. The semiconductor device including a first back end of line (BEOL) layer, the first BEOL layer including a first signal line and a second signal line, a conformal dielectric surrounding an upper portion of a vertical sidewall of each of the first signal line and the second signal line, and an air gap between the first signal line and the second signal line, where a vertical side surface of the air gap is a vertical side surface of the first signal line.

According to an embodiment, a method is provided. The method including forming a first metal line and a second metal line in a sacrificial material in a first back end of line (BEOL) layer, removing the sacrificial material, forming a conformal dielectric surrounding vertical side surfaces of the first metal line and the second metal line, where an air gap between the first metal line and the second metal line exposes an upper horizontal surface of a dielectric layer below the first BEOL layer, and growing a dielectric selectively from an upper portion of the conformal dielectric, where the air gap remains between the first metal line and the second metal line.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

Figure 1:
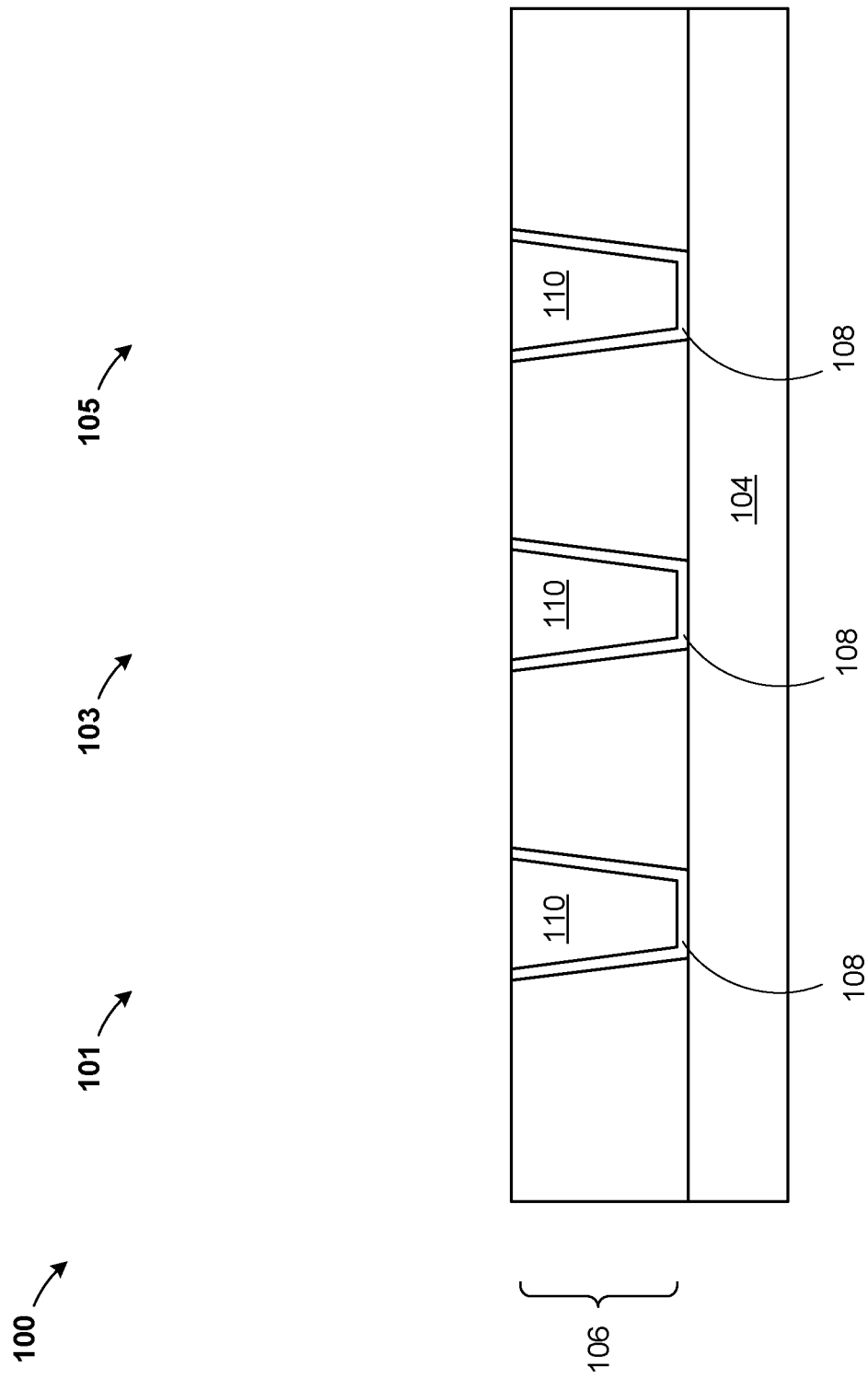
FIG. 1 illustrates a cross-sectional view of a semiconductor structure at an intermediate stage of fabrication, according to an exemplary embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As stated above, back-end-of-the-line (BEOL) processing of semiconductor technologies (such as CMOS technologies) includes forming an interlayer dielectric on active circuitry, forming backside metal lines in the interlayer dielectric, forming vias connecting the backside metal lines to the active circuitry, forming a backside power delivery network and forming vias connecting the backside metal line and the active circuitry to the backside power delivery network. As scaling of interconnects, such as metal lines and vias, are reduced, reducing capacitance is important to reduce an RC (resistive capacitive) delay between adjacent metal lines and vias. Forming a large size air gap surrounding the metal lines and vias helps to reduce capacitance in tight pitch interconnect structure. A conventional method of forming airgap does not produce large air gaps. This proposed invention allows forming large air gaps in a tight pitch structure (pitch<18 nm) allowing scaling of interconnect without significant RC increase. A large size air gap may be a 6-9 nm of the intra-level space between typically 18 nm pitch metal lines (⅓ to ½ of tight pitch structure). A convention method of forming an airgap may form an air gap with a size of 2-6 nm of the intra-level space between typically 18 nm pitch metal lines (⅑ to ⅓ of tight pitch structure).

The present invention relates, generally to semiconductor devices, including CMOS logics devices, memories such as Magnetic Random Access Memory (MRAM), Phase Change (PCM), Non-volatile Memory and other Memory integrated Logic Device, System on Chip (SOC). that need capacitance reduction for overall RC reduction by forming airgap between intra-level metal line. The capacitance reduction will enhance device performance. The method including the fabrication of a logic pillar memory either alone or integrated, the formation of patterned conducting metal wiring line by RIE patterning or damascene and removal of specific interlevel dielectric region, the selective metal oxide (example typically AlOx deposition) and then subsequent various deposition and integrated processing fabrication steps to form a specific airgap between metal lines with various airgap volumes for either maximum capacitance reduction with optimal airgap volume or reduce airgap volume but with maximum sidewall protection.

The present invention relates, generally, to the field of semiconductor manufacturing, and more particularly to fabricating a back end of line (BEOL) interconnect structure with an air gap.

Advantages of the current invention include consistent formation of an air gap or cavity via patterning, providing increased thermal isolation of between adjacent signal lines, and reducing capacitance of the signal lines. Reducing capacitance of the signal lines is important to reduce RC (resistance capacitance) delay for scaling of interconnects for future technology nodes. Forming an air gap of a maximum volume/size, especially for a stable metal such as ruthenium (Ru), iridium (Ir) and rhodium (Rh), which may need little sidewall oxidation protection, helps to reduce capacitance in a tight pitch interconnect structure. The proposed invention allows forming air gaps in tight pitch structure (pitch<18 nm) allowing scaling of interconnect without significant RC increase.

In an embodiment, metal lines are first formed using either a damascene or a subtractive etch process. For damascene process metal lines are formed in sacrificial material which is removed using isotropic etch process after metal lines are formed. In an embodiment a dielectric liner/spacer is deposited and etched back to form sidewall spacer around metal lines. Another sacrificial flowable material is then deposited using spin coating or similar process followed by selective dielectric deposition and pinch off. The sacrificial material is removed to form air gap.

In another embodiment, sacrificial flowable material is first deposited after metal line formation. A dielectric liner is formed and selective deposition of dielectric is used to pinch off at the top. Sacrificial material is removed to form air gap. A dielectric cap and a next layer of dielectric are deposited. Metal lines and vias are formed using standard process. A selectively deposited film acts as an etch stop for next metal level via allowing self-alignment.

Embodiments of the present invention disclose a structure and a method of forming a and more particularly to fabricating back end of line (BEOL) interconnect structure with an air gap are described in detail below by referring to the accompanying drawings in FIGS. 1-18, in accordance with an illustrative embodiment.

Referring now to FIG. 1, a semiconductor structure 100 (hereinafter "structure") at an intermediate stage of fabrication is shown according to an exemplary embodiment. FIG. 1 is a cross-sectional view of the structure 100. FIG. 1 illustrates a cross section of three signal lines, including signal line 101, signal line 103 and signal line 105.

The structure 100 may include several back end of line ("BEOL") layers. In general, the back end of line (BEOL) is the second portion of integrated circuit fabrication where the individual devices (transistors, capacitors, resistors, etc.) are interconnected with wiring on the wafer. There may be several layers of circuitry below the structure 100. As shown in FIG. 1, a first BEOL layer includes a BEOL dielectric layer 104. A second BEOL layer on the first BEOL layer includes a sacrificial layer 106 surrounding a BEOL metal layer 110.

The BEOL dielectric layer 104 may be formed by conformally depositing or growing a dielectric and performing an isotropic etch process. The BEOL dielectric layer 104 may include one or more layers. The BEOL dielectric layer 104 may be composed of, for example, silicon oxide (SiOx), silicon nitride (SiNx), silicon boron carbonitride (SiBCN), NBLOK, a low-k dielectric material (with k<4.0), including but not limited to, silicon oxide, spin-on-glass, a flowable oxide, a high density plasma oxide, borophosphosilicate glass (BPSG), or any combination thereof or any other suitable dielectric material.

The sacrificial layer 106 may be blanket deposited on the structure 100, according to an exemplary embodiment. The sacrificial layer 106 may be deposited on the BEOL dielectric layer 104. The sacrificial layer 106 may be deposited using typical deposition techniques, for example, atomic layer deposition (ALD), molecular layer deposition (MLD), chemical vapor deposition (CVD), physical vapor deposition (PVD), and spin on techniques. The material of the sacrificial layer 106 may include silicon nitride, amorphous silicon, silicon oxynitride, boron nitride, silicon oxide, or any combination of these materials. In a preferred embodiment, the sacrificial layer 106 may include amorphous silicon because it can be easily removed selective to surrounding materials.

The BEOL metal layer 110 may be formed by methods known in the arts and include several steps. The BEOL metal layer 110 may be formed by a damascene process with metal such as copper (Cu), cobolt (Co), ruthenium (Ru), tungsten (W), molybdenum (Mo), or a combination thereof, followed by CMP. Damascene process is a conventional metallization process which trenches (or vias) are formed first in the sacrificial layer 106 followed by metal deposition and CMP. The BEOL metal layer 110 can be formed by for example, chemical vapor deposition (CVD), physical vapor deposition (PVD), and atomic layer deposition (ALD) or a combination thereof.

In an embodiment, a thin metal liner 108 such as tantalum (Ta), titanium (Ti), titanium nitride (TiN), ruthenium (Ru), or a combination thereof, may be deposited prior to bulk metal fill. The BEOL metal layer 110 is a signal line. FIG. 1 illustrates three signal lines, including signal line 101, signal line 103 and signal line 105, however there may be any number of signal lines in the structure 100.

A planarization process, such as, for example, chemical mechanical polishing (CMP), may be done to remove excess material from a top surface of the sacrificial layer 106 and the BEOL metal layer 110, such that upper horizontal surfaces of the sacrificial layer 106 and the BEOL metal layer 110 are coplanar.

Figure 2:
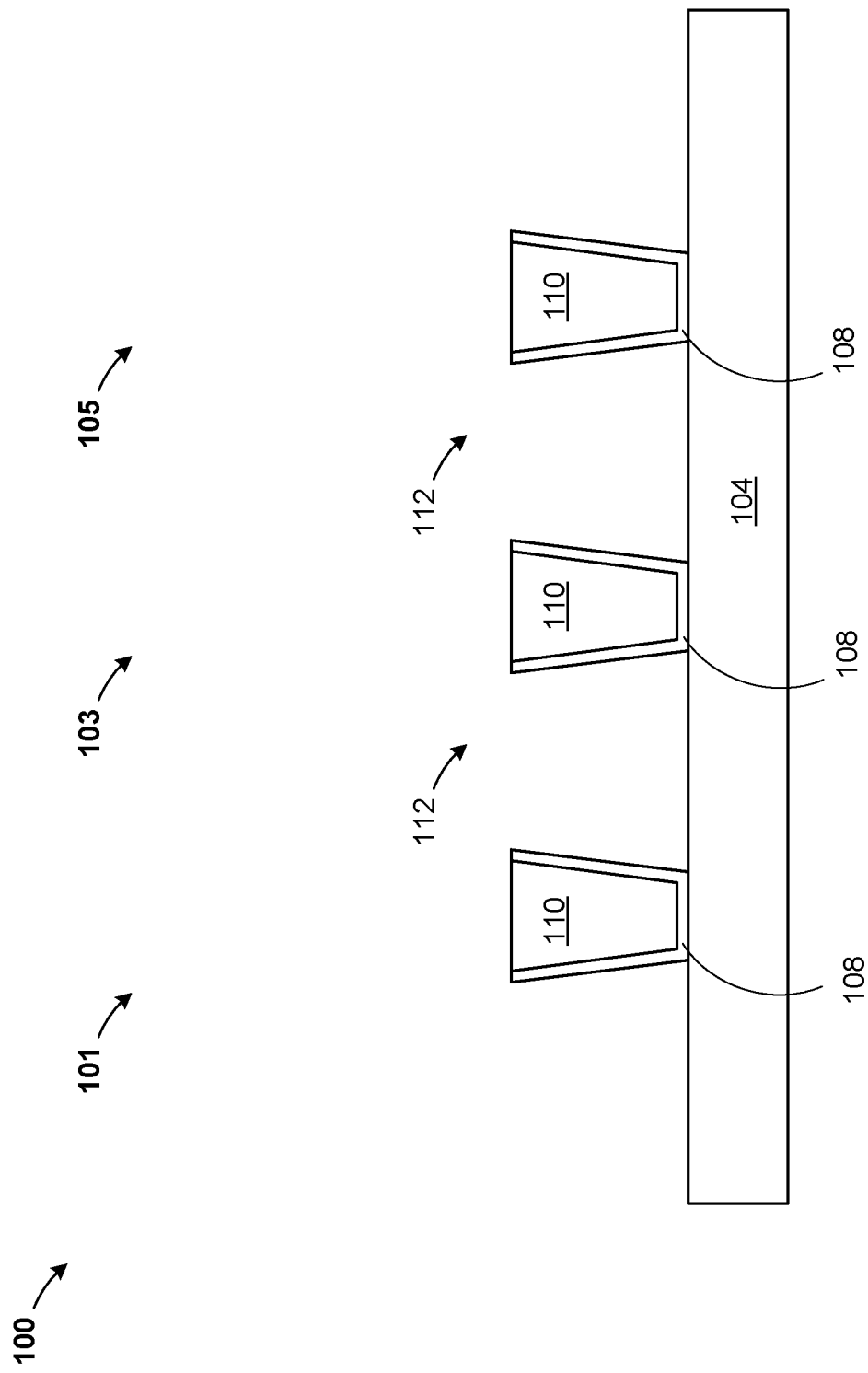
FIG. 2 illustrates removal of a first sacrificial material surrounding metal lines, according to an exemplary embodiment.

Referring now to FIG. 2, the structure 100 is shown according to an exemplary embodiment. The sacrificial layer 106 may be removed.

The sacrificial layer 106 may be selectively removed, creating gaps 112 between adjacent BEOL metal layer 110 of each of the signal lines 101, 103, 105. The sacrificial layer 106 may be removed selective to the BEOL metal layer 110, the thin metal liner 108 and the BEOL dielectric layer 104.

Figure 3:
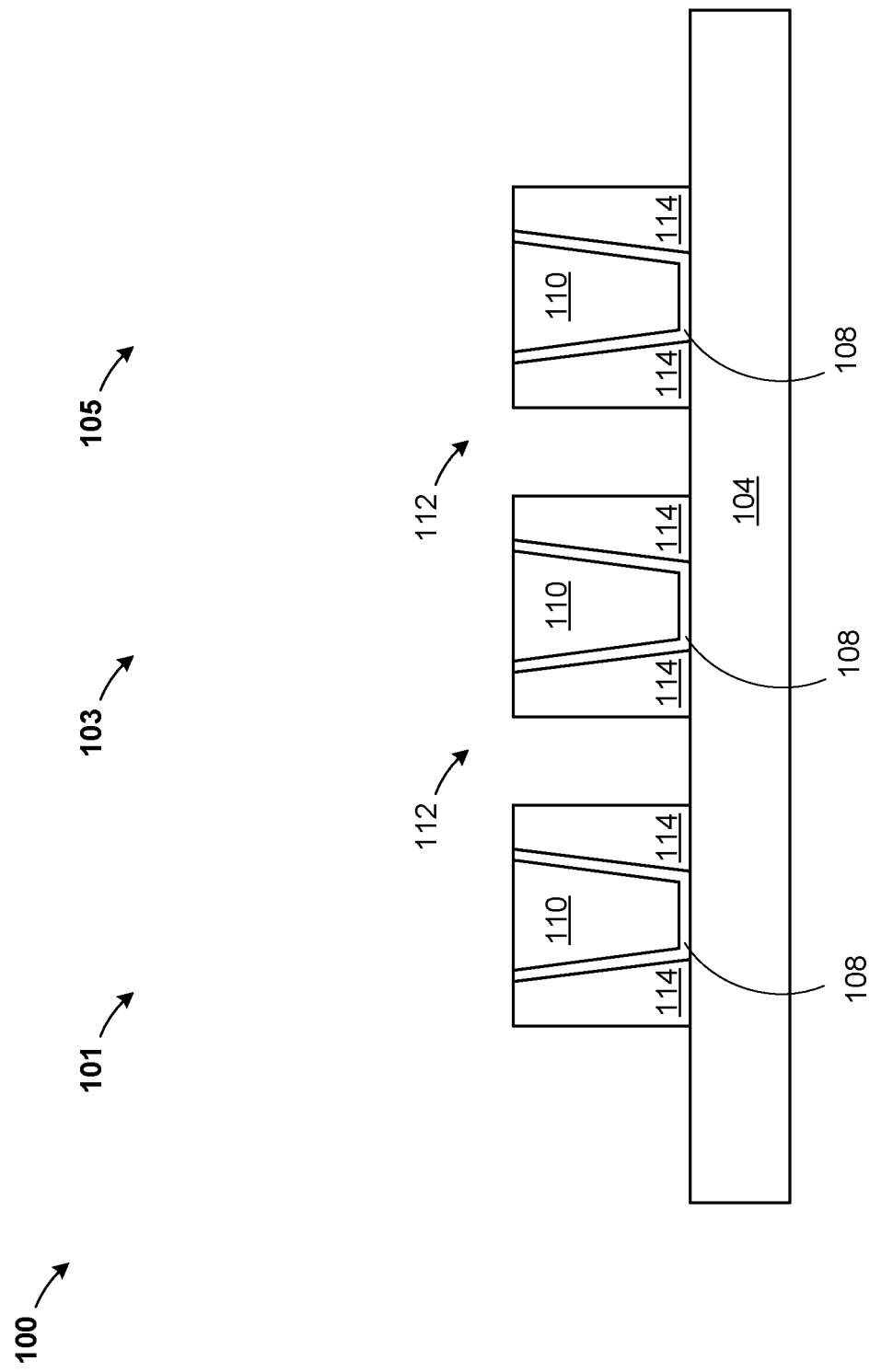
FIG. 3 illustrates deposition of a conformal dielectric, according to an exemplary embodiment.

Referring now to FIG. 3, the structure 100 is shown according to an exemplary embodiment. A conformal dielectric 114 may be deposited.

The conformal dielectric 114 may be formed by conformally depositing or growing a dielectric and performing an isotropic etch process. The conformal dielectric 114 may include one or more layers. The conformal dielectric 114 may be composed of, for example, silicon oxide (SiOx), silicon nitride (SiNx), silicon boron carbonitride (SiBCN), NBLOK, a low-k dielectric material (with k<4.0), including but not limited to, silicon oxide, spin-on-glass, a flowable oxide, a high density plasma oxide, borophosphosilicate glass (BPSG), or any combination thereof or any other suitable dielectric material.

Portions of the conformal dielectric 114 may be removed by, for example, reactive ion etching (RIE), and stopping on the BEOL dielectric layer 104. Upper surfaces of the BEOL metal layer 110 and the thin metal liner 108 may be exposed. Remaining portions of the conformal dielectric 114 may cover vertical side surfaces of the thin metal liner 108 and a portion of an upper surface of the BEOL dielectric layer 104. Gaps 112 may be formed between adjacent signal lines 101, 103, 105, with a lower horizontal surface which is the upper horizontal surface of the BEOL dielectric layer 104 and with a vertical side surface of the conformal dielectric 114.

Figure 4:
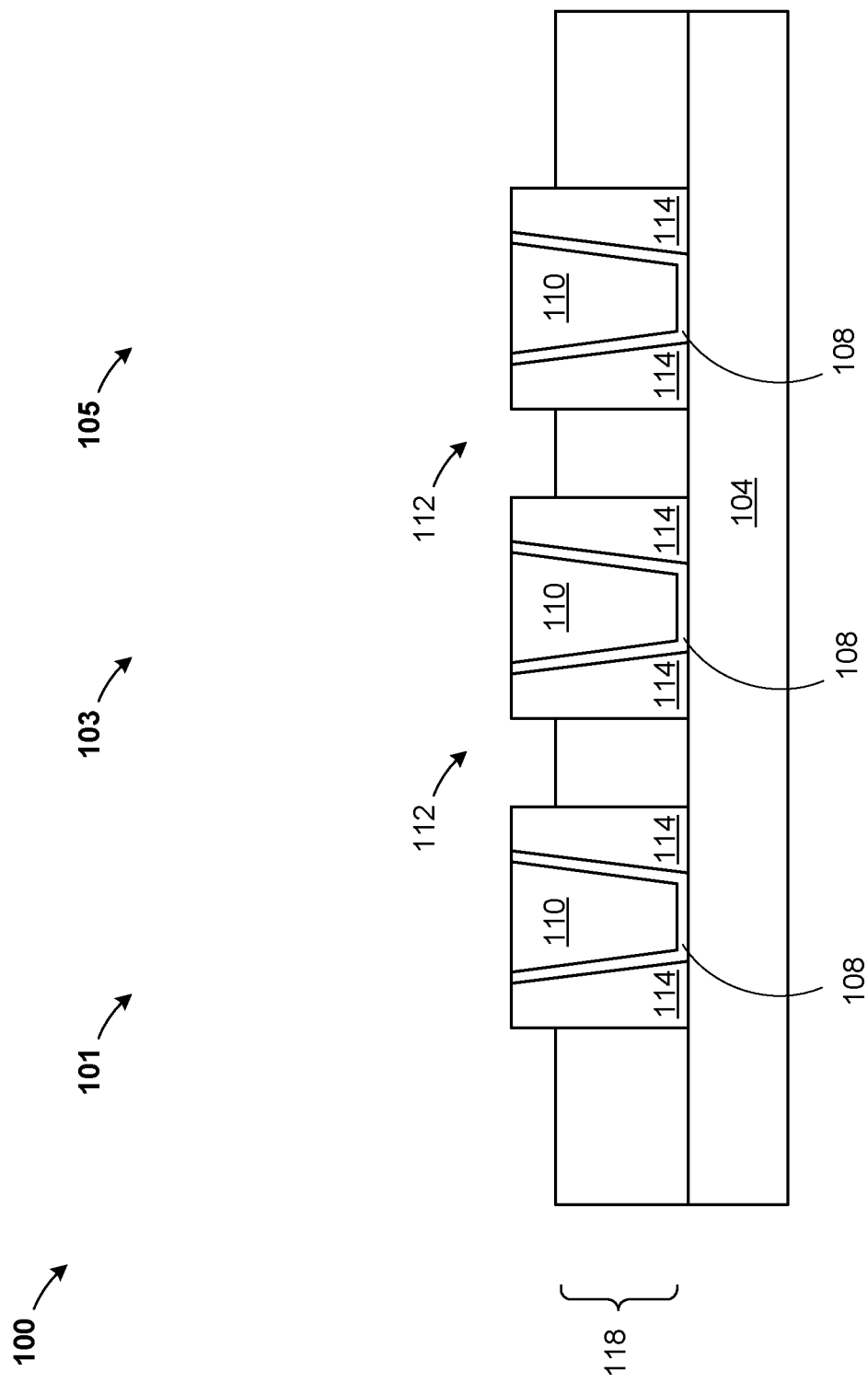
FIG. 4 illustrates formation of a second sacrificial material, according to an exemplary embodiment.

Referring now to FIG. 4, the structure 100 is shown according to an exemplary embodiment. A second sacrificial layer 118 may be deposited.

The second sacrificial layer 118 may be blanket deposited on the structure 100, according to an exemplary embodiment. The sacrificial layer 106 may be deposited on the BEOL dielectric layer 104, on the conformal dielectric 114, the BEOL metal layer 110 and the thin metal liner 108. The second sacrificial layer 118 may be deposited using typical deposition techniques, for example, atomic layer deposition (ALD), molecular layer deposition (MLD), chemical vapor deposition (CVD), physical vapor deposition (PVD), and spin on techniques. The material of the second sacrificial layer 118 may include silicon nitride, amorphous silicon, silicon oxynitride, boron nitride, silicon oxide, or any combination of these materials. In a preferred embodiment, the second sacrificial layer 118 may include material used as an organic planarization layer, formed by a blanket deposition using typical deposition techniques, for example spin-on coating, and include carbon, hydrogen, oxygen, and optionally nitrogen, fluorine, and silicon. The second sacrificial layer 118 may partially fill the gaps 112.

A lithograph patterning and dry etch technique may be used to selectively remove a portion of the second sacrificial layer 118 such that an upper horizontal surface of the second sacrificial layer 118 may be below upper horizontal surfaces of the conformal dielectric 114, the thin metal liner 108 and the BEOL metal layer 110. A lower horizontal surface of the second sacrificial layer 118 may be an upper surface of the BEOL dielectric layer. 104. A vertical side surface of the second sacrificial layer 118 may be a vertical side surface of the conformal dielectric 114. An upper horizontal surface of the second sacrificial layer 118 may be below upper horizontal surfaces of the conformal dielectric 114, the thin metal liner 108 and the BEOL metal layer 110. A portion of a vertical side surface of the conformal dielectric 114 may be exposed in the gap 112.

Figure 5:
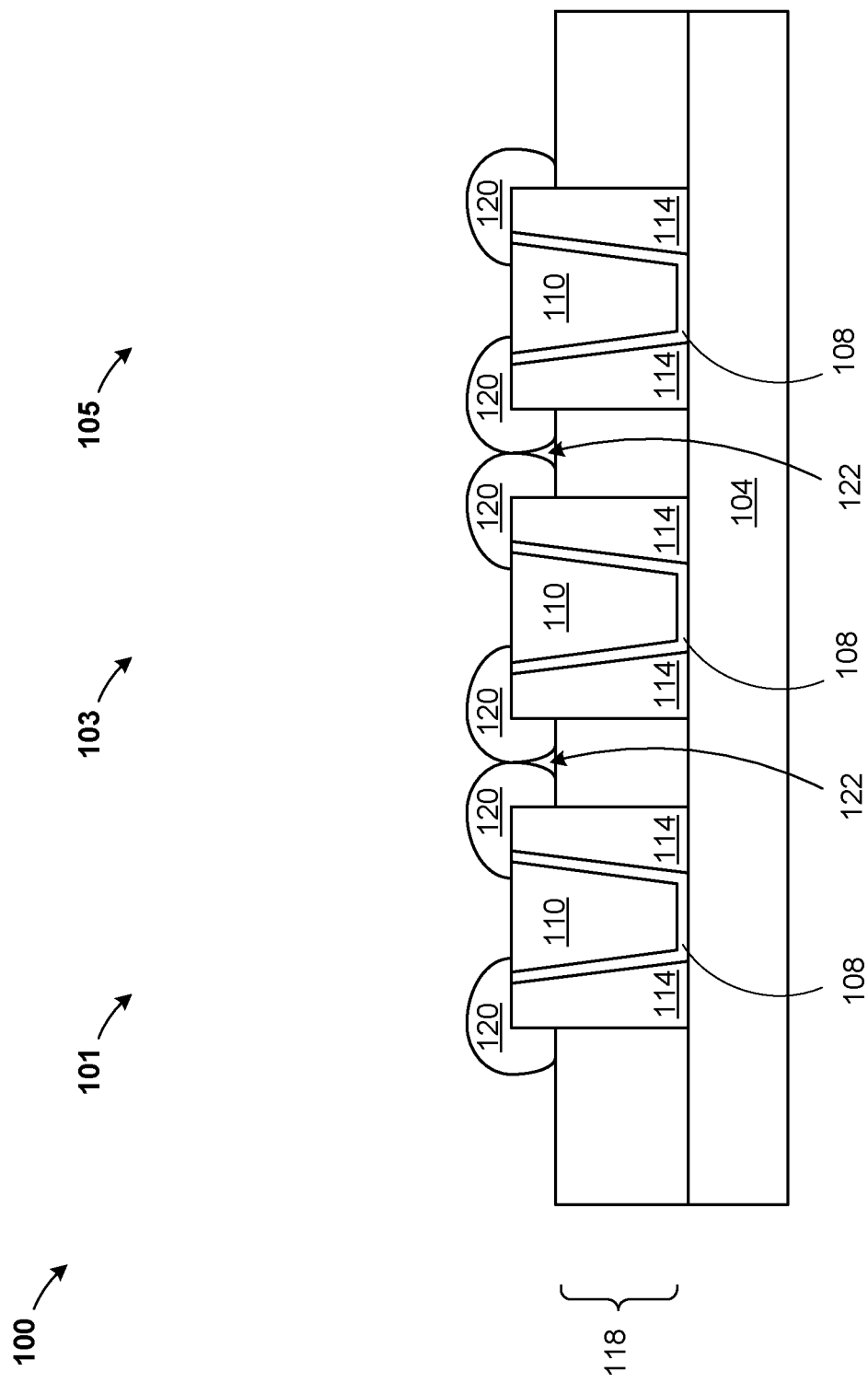
FIG. 5 illustrates select deposition of a dielectric, according to an exemplary embodiment.

Referring now to FIG. 5, the structure 100 is shown according to an exemplary embodiment. A dielectric 120 may be deposited.

The dielectric 120 may be formed by selectively depositing or growing a dielectric. The dielectric 120 may include one or more layers. The dielectric 120 may be grown from exposed horizontal and vertical side surfaces of the conformal dielectric 114. The dielectric 120 may overlap a portion of the BEOL metal layer 110, a portion of the thin metal liner 108 and a portion of the second sacrificial layer 118. The dielectric 120 may fill a portion of the gap 112. A remaining portion of the gap 112 may be the air gap 122, which is above the horizontal upper surface of the second sacrificial layer 118 and below the dielectric 120. Portions of the dielectric 120 may grow outwards from the conformal dielectric 114, leaving the air gap 122. The dielectric 120 may grow outwards from the conformal dielectric 114 and may meet between adjacent BEOL metal layer 110 of the signal lines 101, 103, 105. This may be referred to as a pinch off where the dielectric 120 touches.

The dielectric 120 may include one or more layers. The dielectric 120 may be made of a high-k dielectric material (with k>4.0), including but not limited to, ALOx, HfO$_2$, ZrO$_2$, La$_2$O$_3$, Al$_2$O$_3$, TiO$_2$, SrTiO$_3$, LaAlO$_3$, Y$_2$O$_3$, HfO$_x$N$_y$, ZrO$_x$N$_y$, La$_2$O$_x$N$_y$, Al$_2$O$_x$N$_y$, TiO$_x$N$_y$, SrTiO$_x$N$_y$, LaAlO$_x$N$_y$, Y$_2$O$_x$N$_y$, SiON, SiN$_x$, a silicate thereof, and an alloy thereof.

Figure 6:
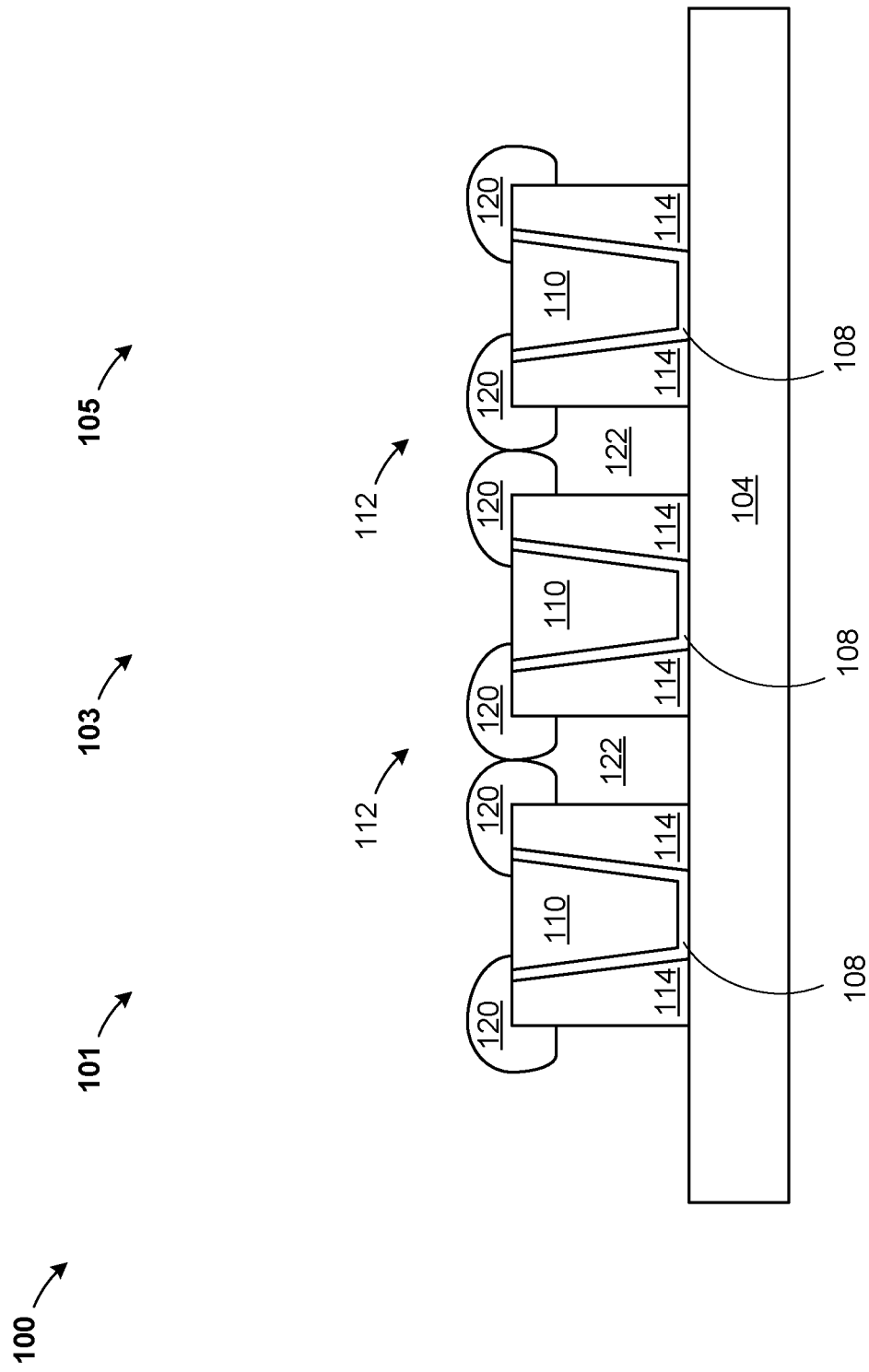
FIG. 6 illustrates removal of the second sacrificial material, according to an exemplary embodiment.

Referring now to FIG. 6, the structure 100 is shown according to an exemplary embodiment. The second sacrificial layer 118 may be removed.

The second sacrificial layer 118 may be removed selective to the dielectric 120, the BEOL metal layer 110, the thin metal liner 108, the conformal dielectric 114 and the BEOL dielectric layer 104. The air gap 122 may be increased by the removal of the second sacrificial layer 118. The dielectric 120 may form an upper horizontal boundary of the air gap 122. The conformal dielectric 114 may provide vertical side boundaries of the air gap 122. The BEOL dielectric layer 104 may provide a lower horizontal boundary of the air gap 122.

Figure 7:
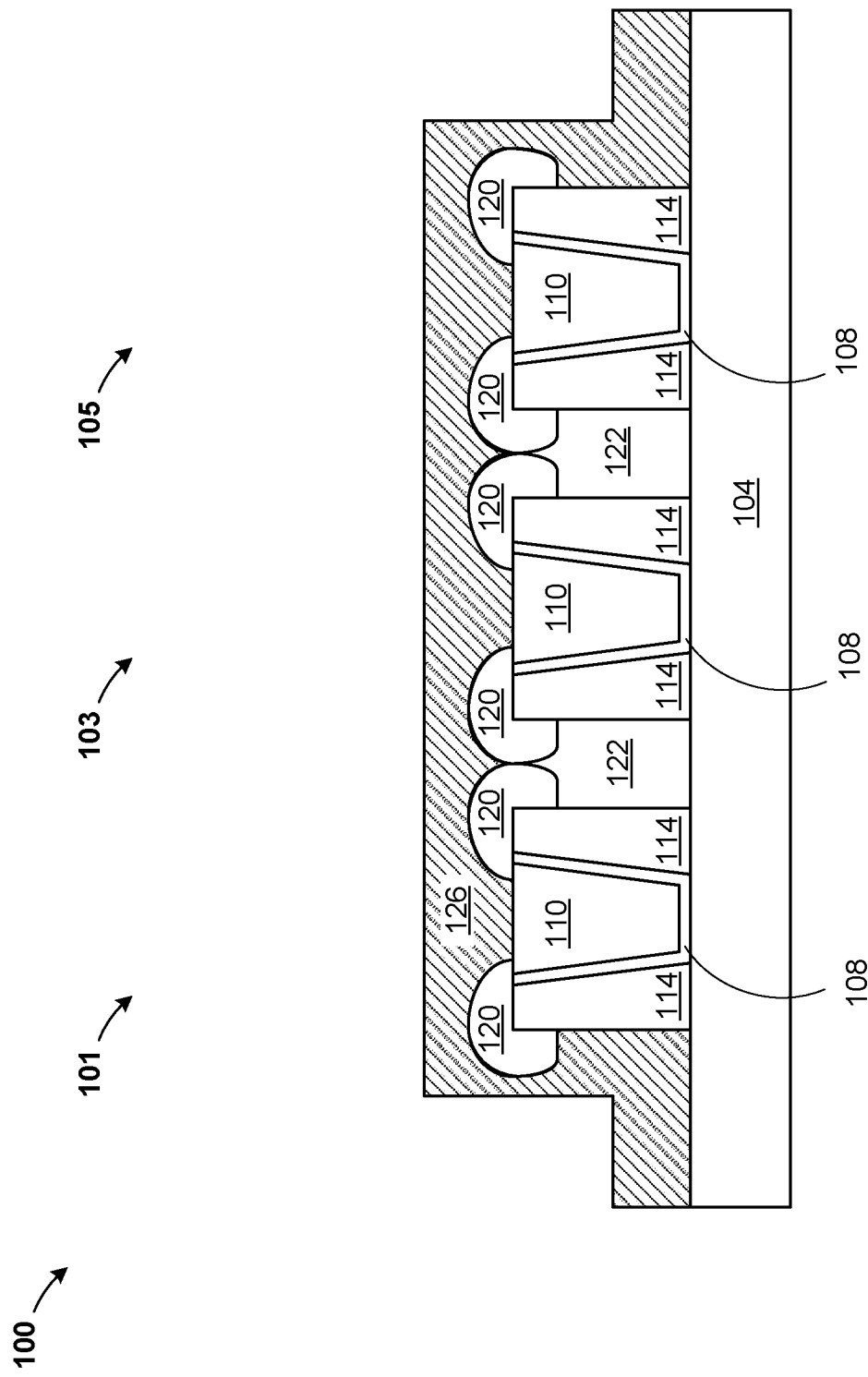
FIG. 7 illustrates deposition of a second dielectric, according to an exemplary embodiment.

Referring now to FIG. 7, the structure 100 is shown according to an exemplary embodiment. A dielectric cap 126 may be formed.

The dielectric cap 126 may be formed by depositing or growing a dielectric material on the dielectric 120, the BEOL metal layer 110, the conformal dielectric 114 and the BEOL dielectric layer 104. The dielectric cap 126 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the dielectric cap 126 may include one or more layers. In an embodiment, the dielectric cap 126 may include any dielectric material such as tetraethyl orthosilicate (TEOS), silicon oxide (SiOx), silicon nitride (SiNx), silicon boron carbonitride (SiBCN), SiCN. SICNO, SiCO, a low-k dielectric material (with k<4.0), including but not limited to, silicon oxide, spin-on-glass, a flowable oxide, a high-density plasma oxide, borophosphosilicate glass (BPSG), or any combination thereof or any other suitable dielectric material.

The air gap 122 may remain between the signal lines 101, 103 and between the signal lines 103, 105, as the air gap 122 is surrounded by the dielectric 120, the conformal dielectric 114 and the BEOL dielectric layer 104.

Figure 8:
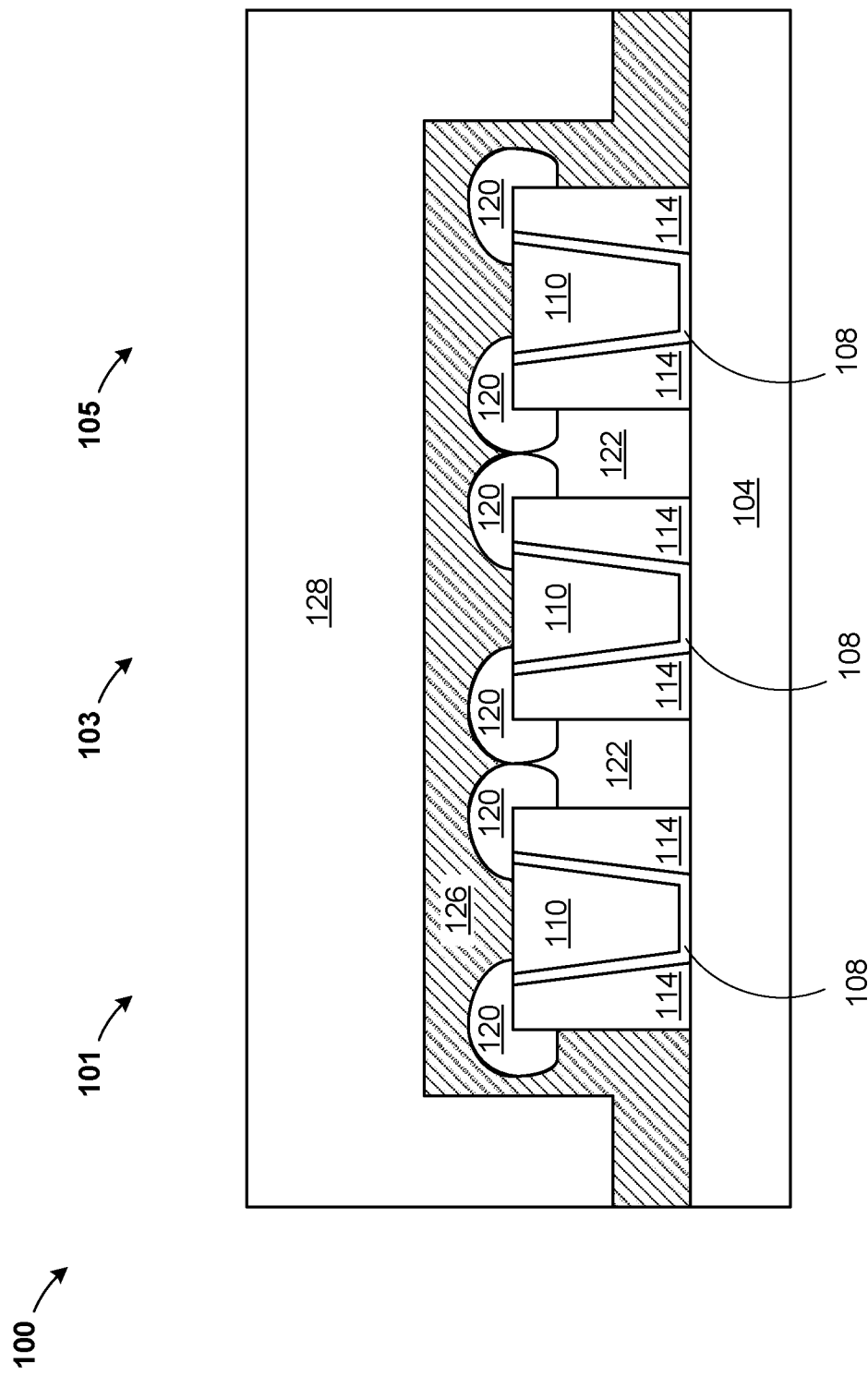
FIG. 8 illustrates deposition of an interlayer dielectric, according to an exemplary embodiment.

Referring now to FIG. 8, the structure 100 is shown according to an exemplary embodiment. A second BEOL dielectric layer 128 may be formed.

The second BEOL dielectric layer 128 may be formed by depositing or growing a dielectric material on the dielectric cap 126, followed by a chemical mechanical polishing (CMP) or etch steps. The second BEOL dielectric layer 128 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the second BEOL dielectric layer 128 may include one or more layers. In an embodiment, the second BEOL dielectric layer 128 may include any dielectric material such as tetraethyl orthosilicate (TEOS), silicon oxide (SiOx), silicon nitride (SiNx), silicon boron carbonitride (SiBCN), NBLOK, a low-k dielectric material (with k<4.0), including but not limited to, silicon oxide, spin-on-glass, a flowable oxide, a high-density plasma oxide, borophosphosilicate glass (BPSG), or any combination thereof or any other suitable dielectric material. NBLoK is a trademark of Applied Materials, Inc.

The structure 100 may be subjected to, for example, CMP to planarize the surface for further processing, such that upper horizontal surfaces of second BEOL dielectric layer 128 is coplanar.

Figure 9:
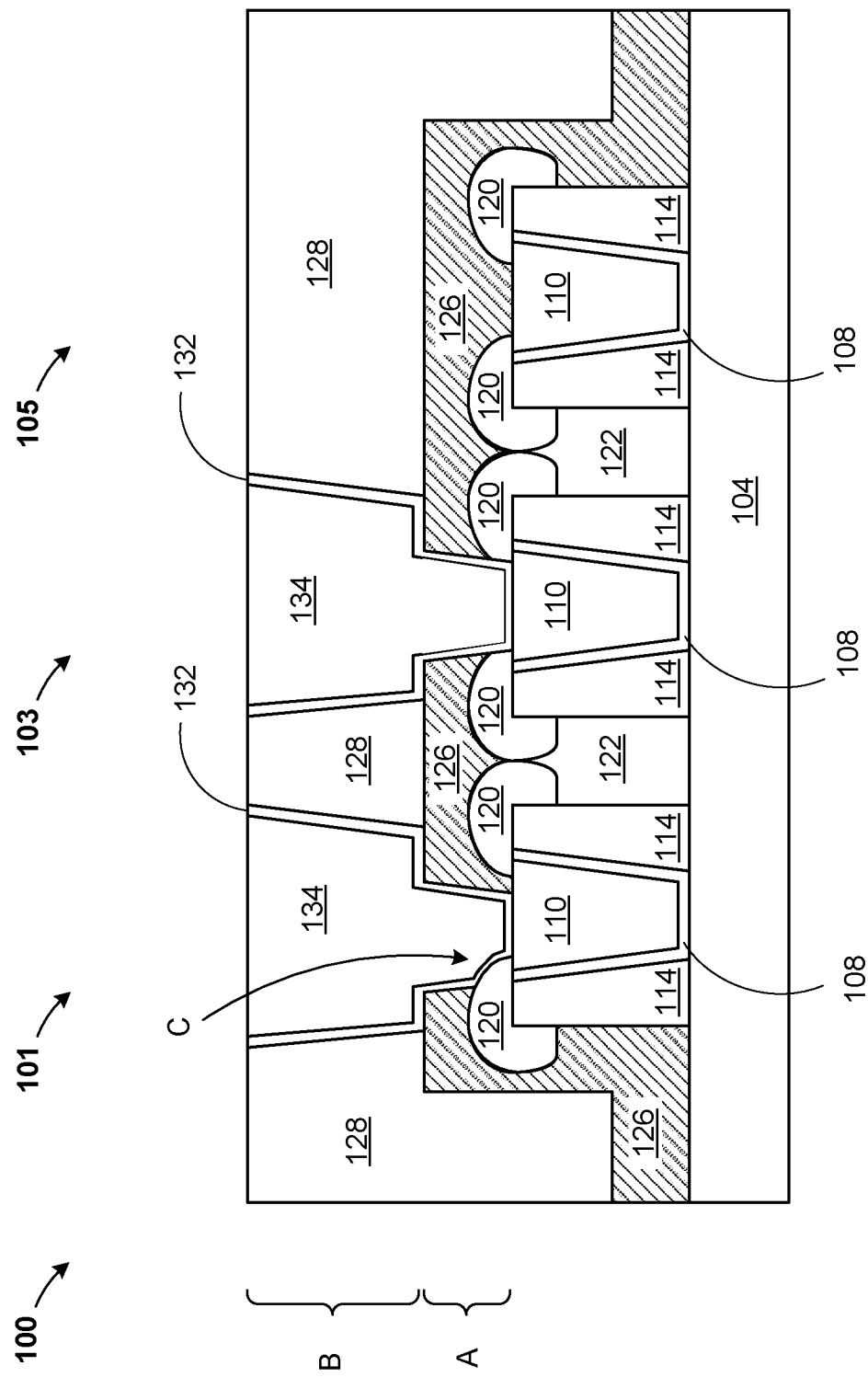
FIG. 9 illustrate formation of a via and a metal line, according to an exemplary embodiment.

Referring now to FIG. 9, the structure 100 is shown according to an exemplary embodiment. A second BEOL metal layer 134 may be formed.

The second BEOL metal layer 134 may include a via portion A and a metal line portion B. The second BEOL metal layer 134 may be formed by methods known in the arts and include several steps. The second BEOL metal layer 134 may be formed by a damascene process with metal such as copper (Cu), cobalt (Co), ruthenium (Ru), tungsten (W), molybdenum (Mo), or a combination thereof, followed by CMP. Damascene process is a conventional metallization process which trenches are formed first in the second BEOL dielectric layer 128 and a via is formed in the dielectric cap 126, followed by metal deposition and CMP. The second BEOL metal layer 134 can be formed by for example, chemical vapor deposition (CVD), physical vapor deposition (PVD), and atomic layer deposition (ALD) or a combination thereof.

In an embodiment, a thin metal liner 132 such as tantalum (Ta), titanium (Ti), titanium nitride (TiN), ruthenium (Ru), or a combination thereof, may be deposited prior to bulk metal fill. The portion B of the second BEOL metal layer 134 is a signal line. The portion A of the second BEOL metal layer 134 is a via. FIG. 9 illustrates two signal lines of the portion B of the second BEOL metal layer 134, however there may be any number of signal lines in the structure 100, each of which may connect to a BEOL metal layer 210.

A planarization process, such as, for example, chemical mechanical polishing (CMP), may be done to remove excess material from a top surface of the second BEOL dielectric layer 128, the thin metal liner 132 and the second BEOL metal layer 134, such that upper horizontal surfaces are coplanar.

The formation of the via portion A and the metal line portion B of the second BEOL metal layer 134 is self-aligning. Referring to the point C of the FIG. 9, as shown, when the opening (not shown) for the via portion A of the second BEOL metal layer 134 is formed, the opening may not be centered over the BEOL metal layer 110. The material of the dielectric 120 prevents over etching of the opening (not shown), allowing for self-alignment of the opening (not shown) for the BEOL metal layer 110.

The structure 100 illustrates a BEOL interconnect structure with an air gap 122, which provides increased thermal isolation of between adjacent signal lines 101, 103, 105, and reducing capacitance of the signal lines 101, 103, 105.

Figure 10:
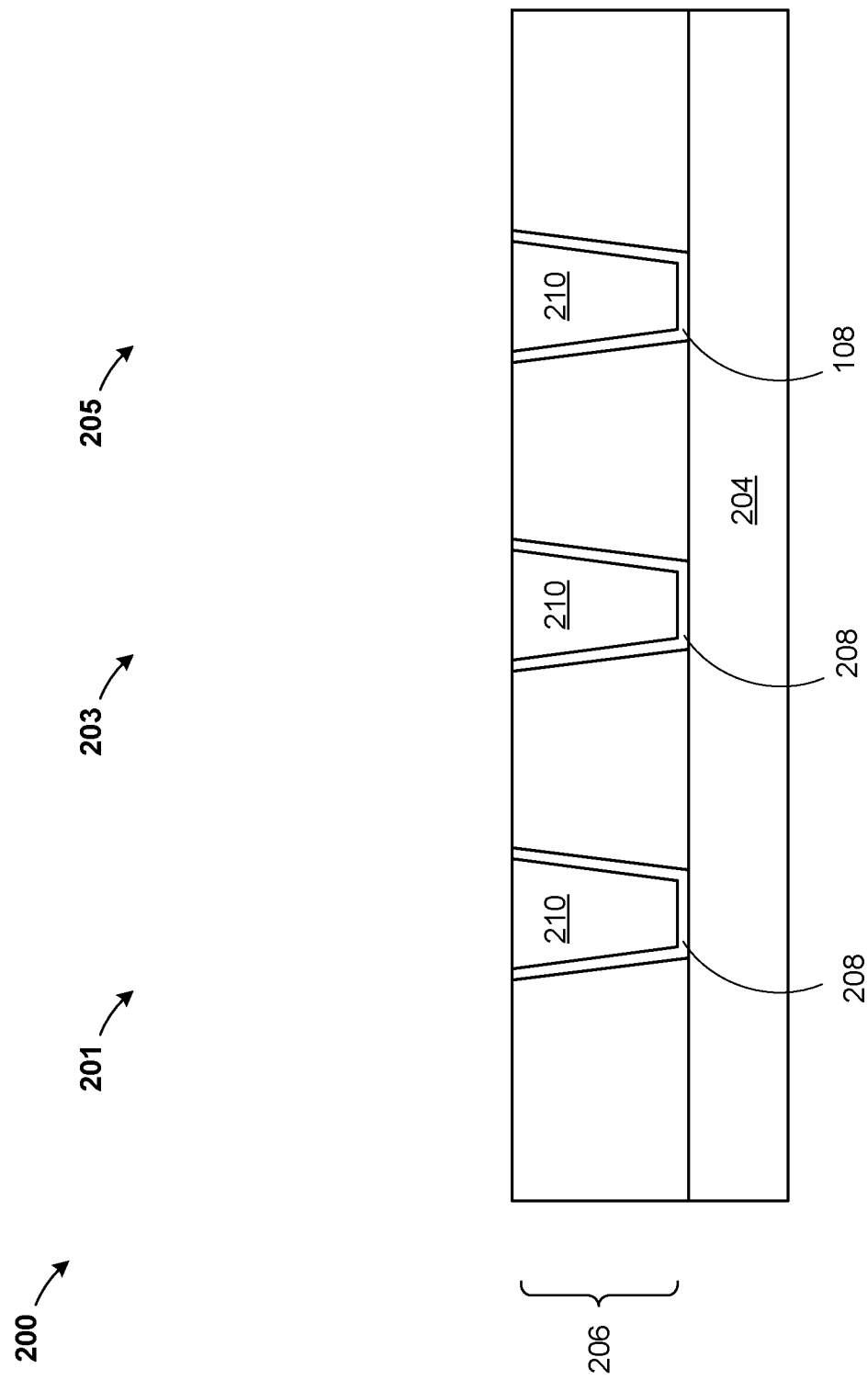
FIG. 10 illustrates a cross-sectional view of another semiconductor structure at an intermediate stage of fabrication, according to an exemplary embodiment.

Referring now to FIG. 10, a semiconductor structure 200 (hereinafter "structure") at an intermediate stage of fabrication is shown according to an alternate exemplary embodiment. FIG. 2 is a cross-sectional view of the structure 200. FIG. 1 illustrates a cross section of three signal lines, including signal line 201, signal line 203 and signal line 205.

The structure 200 may include several back end of line ("BEOL") layers. In general, the back end of line (BEOL) is the second portion of integrated circuit fabrication where the individual devices (transistors, capacitors, resistors, etc.) are interconnected with wiring on the wafer. There may be several layers of circuitry below the structure 200. As shown in FIG. 10, a first BEOL layer includes a BEOL dielectric layer 204. A second BEOL layer on the first BEOL layer includes a sacrificial layer 206 surrounding a BEOL metal layer 210.

The BEOL dielectric layer 204 may be formed by conformally depositing or growing a dielectric and performing an isotropic etch process. The BEOL dielectric layer 204 may include one or more layers. The BEOL dielectric layer 1204 may be composed of, for example, silicon oxide (SiOx), silicon nitride (SiNx), silicon boron carbonitride (SiBCN), NBLOK, a low-k dielectric material (with k<4.0), including but not limited to, silicon oxide, spin-on-glass, a flowable oxide, a high density plasma oxide, borophosphosilicate glass (BPSG), or any combination thereof or any other suitable dielectric material.

The sacrificial layer 206 may be blanket deposited on the structure 200, according to an exemplary embodiment. The sacrificial layer 206 may be deposited on the BEOL dielectric layer 204. The sacrificial layer 206 may be deposited using typical deposition techniques, for example, atomic layer deposition (ALD), molecular layer deposition (MLD), chemical vapor deposition (CVD), physical vapor deposition (PVD), and spin on techniques. The material of the sacrificial layer 106 may include silicon nitride, amorphous silicon, silicon oxynitride, boron nitride, silicon oxide, or any combination of these materials. In a preferred embodiment, the sacrificial layer 106 may include amorphous silicon because it can be easily removed selective to surrounding materials.

The BEOL metal layer 210 may be formed by methods known in the arts and include several steps. The BEOL metal layer 210 may be formed by a damascene process with metal such as copper (Cu), cobalt (Co), ruthenium (Ru), tungsten (W), molybdenum (Mo), or a combination thereof, followed by CMP. Damascene process is a conventional metallization process which trenches (or vias) are formed first in the sacrificial layer 206 followed by metal deposition and CMP. The BEOL metal layer 210 can be formed by for example, chemical vapor deposition (CVD), physical vapor deposition (PVD), and atomic layer deposition (ALD) or a combination thereof.

In an embodiment, a thin metal liner 208 such as tantalum (Ta), titanium (Ti), titanium nitride (TiN), ruthenium (Ru), or a combination thereof, may be deposited prior to bulk metal fill. The BEOL metal layer 210 is a signal line. FIG. 10 illustrates three signal lines, including signal line 201, signal line 203 and signal line 205, however there may be any number of signal lines in the structure 200.

A planarization process, such as, for example, chemical mechanical polishing (CMP), may be done to remove excess material from a top surface of the sacrificial layer 206 and the BEOL metal layer 210, such that upper horizontal surfaces of the sacrificial layer 106 and the BEOL metal layer 210 are coplanar.

The FIG. 10 may be formed as described for the FIG. 1 and may not have differences at this point of the fabrication process.

Figure 11:
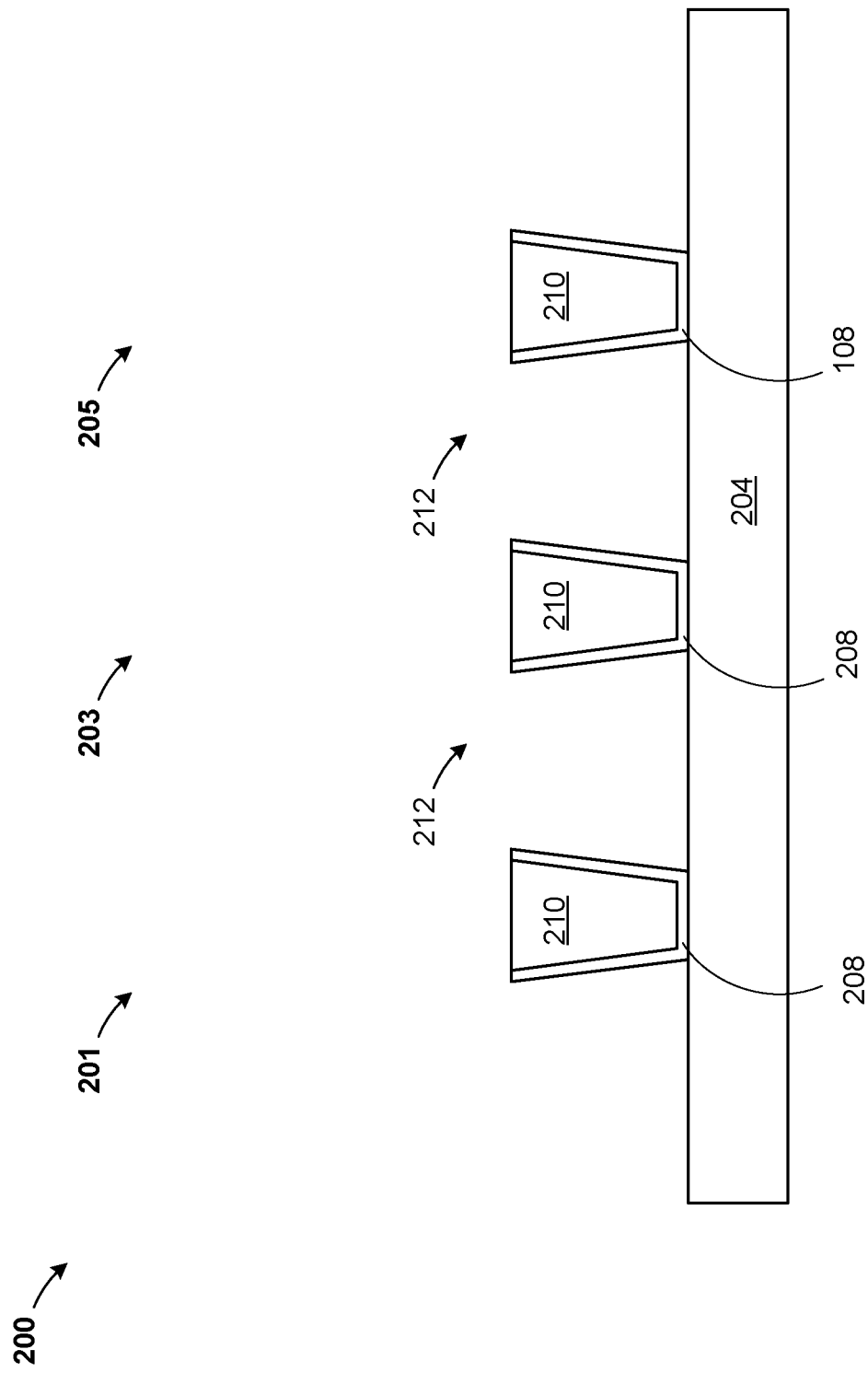
FIG. 11 illustrates removal of a first sacrificial material surrounding metal lines, according to an exemplary embodiment.

Referring now to FIG. 11, the structure 200 is shown according to an exemplary embodiment. The sacrificial layer 206 may be removed.

The sacrificial layer 206 may be selectively removed, creating gaps 212 between adjacent BEOL metal layer 210 of each of the signal lines 201, 203, 205. The sacrificial layer 206 may be removed selective to the BEOL metal layer 210, the thin metal liner 208 and the BEOL dielectric layer 204. The gap 212 may have a lower horizontal boundary which is an upper horizontal surface of the BEOL dielectric layer 204. The gap 212 may have a vertical side boundary which is a vertical side surface of the thin metal liner 208.

The FIG. 11 may be formed as described for the FIG. 2 and may not have differences at this point of the fabrication process.

Figure 12:
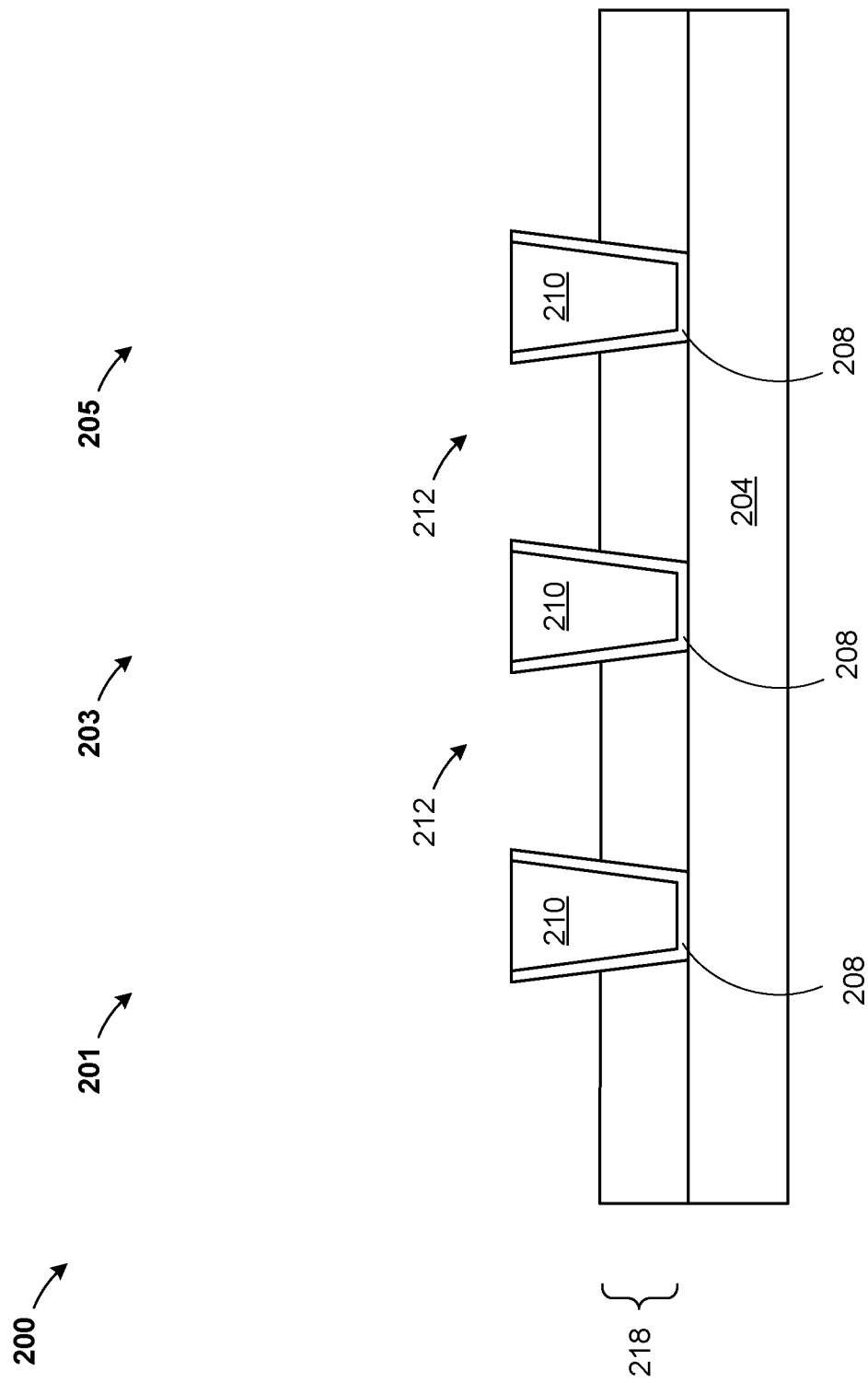
FIG. 12 illustrates formation of a second sacrificial material, according to an exemplary embodiment.

Referring now to FIG. 12, the structure 200 is shown according to an exemplary embodiment. A second sacrificial layer 218 may be deposited.

The second sacrificial layer 218 may be blanket deposited on the structure 200, according to an exemplary embodiment. The sacrificial layer 206 may be deposited on the BEOL dielectric layer 204, on the BEOL metal layer 210 and the thin metal liner 208. The second sacrificial layer 218 may be deposited using typical deposition techniques, for example, atomic layer deposition (ALD), molecular layer deposition (MLD), chemical vapor deposition (CVD), physical vapor deposition (PVD), and spin on techniques. The material of the second sacrificial layer 218 may include silicon nitride, amorphous silicon, silicon oxynitride, boron nitride, silicon oxide, or any combination of these materials. In a preferred embodiment, the second sacrificial layer 218 may include material used as an organic planarization layer, formed by a blanket deposition using typical deposition techniques, for example spin-on coating, and include carbon, hydrogen, oxygen, and optionally nitrogen, fluorine, and silicon. The second sacrificial layer 218 may partially fill the gaps 112.

A lithograph patterning and dry etch technique may be used to selectively remove a portion of the second sacrificial layer 218 such that an upper horizontal surface of the second sacrificial layer 218 may be below upper horizontal surfaces of the thin metal liner 208 and the BEOL metal layer 210. A lower horizontal surface of the second sacrificial layer 218 may be an upper surface of the BEOL dielectric layer. 204. A vertical side surface of the second sacrificial layer 218 may be a vertical side surface of the thin metal liner 208. An upper horizontal surface of the second sacrificial layer 218 may be below upper horizontal surfaces of the thin metal liner 208 and the BEOL metal layer 210. A portion of a vertical side surface of the thin metal liner 208 may be exposed in the gap 212.

The gap 212 may be partially filled by the second sacrificial layer 218. The gap 212 may have a lower horizontal boundary which is an upper horizontal surface of the second sacrificial layer 218. The gap 212 may have a vertical side boundary which is a vertical side surface of the thin metal liner 208.

The FIG. 12 is different than the FIG. 3 as the second sacrificial layer 218 is formed in the FIG. 12 and in the FIG. 3 the conformal dielectric 114 is formed before the second sacrificial layer 218.

Figure 13:
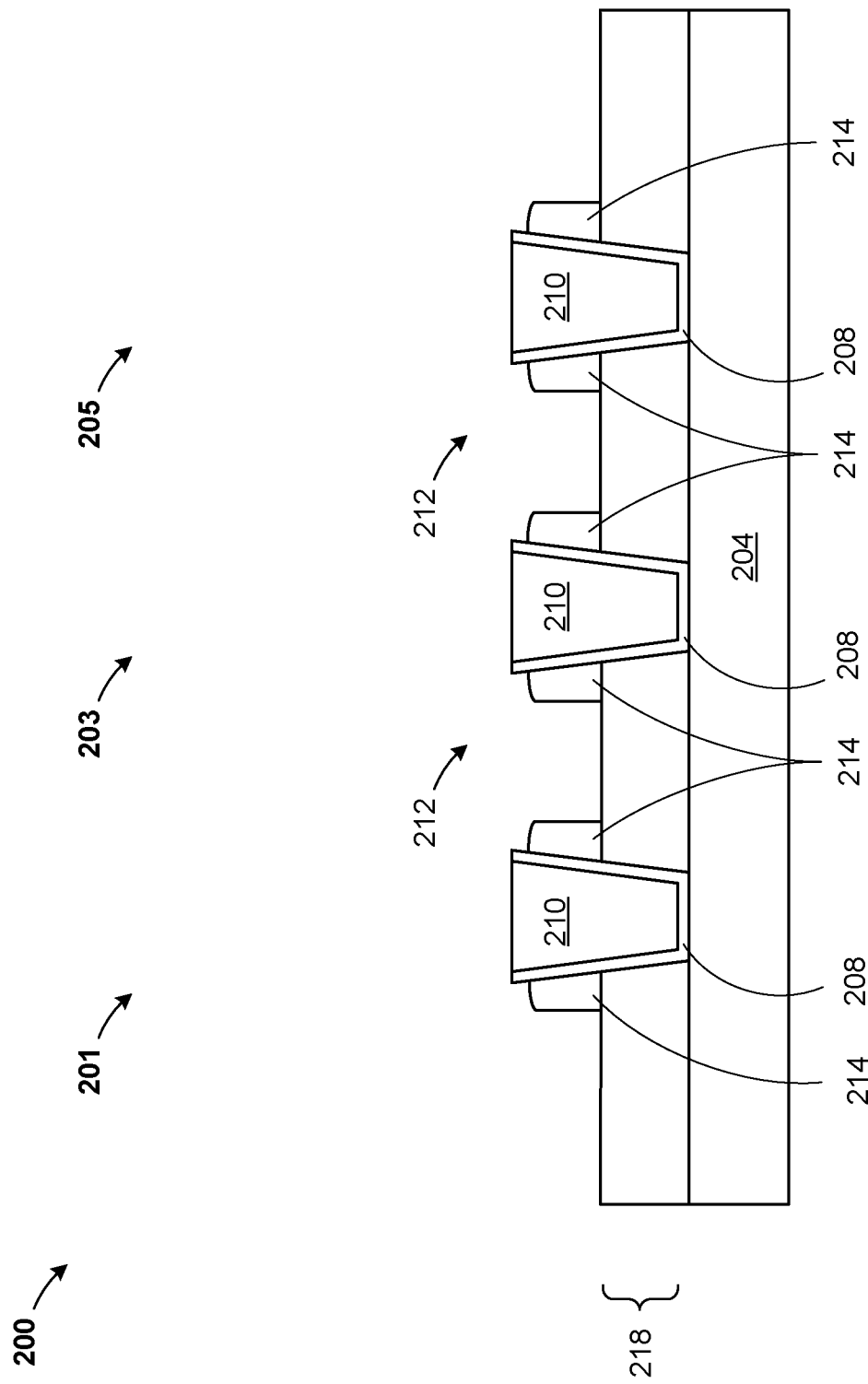
FIG. 13 illustrates deposition of a conformal dielectric, according to an exemplary embodiment.

Referring now to FIG. 13, the structure 200 is shown according to an exemplary embodiment. A conformal dielectric 214 may be deposited.

The conformal dielectric 214 may be formed by conformally depositing or growing a dielectric and performing an isotropic etch process. The conformal dielectric 214 may include one or more layers. The conformal dielectric 214 may be composed of, for example, silicon oxide (SiOx), silicon nitride (SiNx), silicon boron carbonitride (SiBCN), SiCN, SiCNO, SiCO, a low-k dielectric material (with k<4.0), including but not limited to, silicon oxide, spin-on-glass, a flowable oxide, a high density plasma oxide, borophosphosilicate glass (BPSG), AlOx, MnSiOx, or any combination thereof or any other suitable dielectric material.

Portions of the conformal dielectric 214 may be removed by, for example, reactive ion etching (RIE), and stopping on the second sacrificial layer 218. Upper surfaces of the BEOL metal layer 210 and the thin metal liner 208 may be exposed.

A portion of a vertical side surface of the metal layer 210 may be exposed. Remaining portions of the conformal dielectric 214 may cover vertical side surfaces of the thin metal liner 208 and a portion of an upper surface of the second sacrificial layer 218. The conformal dielectric 214 may fill a portion of the gap 112. The gap 112 may have a lower horizontal boundary which is the upper horizontal surface of the second sacrificial layer 218 and a vertical side boundary of the conformal dielectric 114.

The FIG. 13 is different than the FIG. 4 as the second sacrificial layer 218 is formed before the conformal dielectric 214 and in the FIG. 4, the conformal dielectric 114 is formed before the second sacrificial layer 218.

Figure 14:
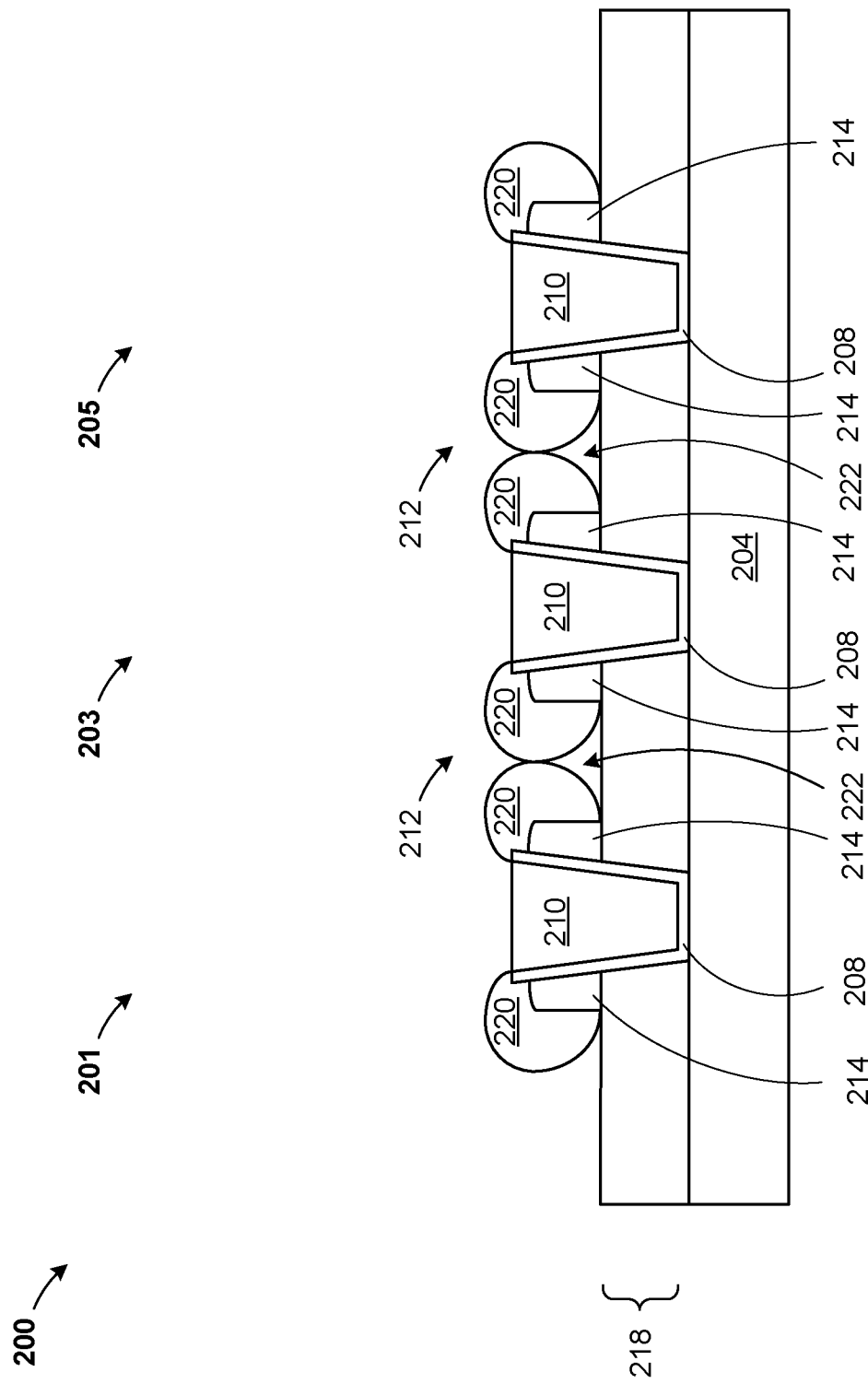
FIG. 14 illustrates select deposition of a dielectric, according to an exemplary embodiment.

Referring now to FIG. 14, the structure 100 is shown according to an exemplary embodiment. A dielectric 220 may be deposited.

The dielectric 220 may be formed by selectively depositing or growing a dielectric. The dielectric 220 may include one or more layers. The dielectric 220 may be grown from exposed horizontal and vertical side surfaces of the conformal dielectric 214. The dielectric 220 may overlap a portion of the BEOL metal layer 210, a portion of the thin metal liner 208 and a portion of the second sacrificial layer 218. The dielectric 220 may fill a portion of the gap 212. A remaining portion of the gap 212 may be the air gap 222, which is above the horizontal upper surface of the second sacrificial layer 218 and below the dielectric 220. Portions of the dielectric 220 may grow outwards from the conformal dielectric 214, leaving the air gap 222. The dielectric 220 may grow outwards from the conformal dielectric 214 and may meet between adjacent BEOL metal layer 210 of the signal lines 201, 203, 205. This may be referred to as a pinch off where the dielectric 220 touches.

The dielectric 220 may include one or more layers. The dielectric 220 may be made of a high-k dielectric material (with k>4.0), including but not limited to, AlOx, HfO$_2$, ZrO$_2$, MnOx, La$_2$O$_3$, Al$_2$O$_3$, TiO$_2$, SrTiO$_3$, LaAlO$_3$, Y$_2$O$_3$, HfO$_x$N$_y$, ZrO$_x$N$_y$, La$_2$O$_x$N$_y$, Al$_2$O$_x$N$_y$, TiO$_x$N$_y$, SrTiO$_x$N$_y$, LaAlO$_x$N$_y$, Y$_2$O$_x$N$_y$, SiON, SiN$_x$, a silicate thereof, and an alloy thereof.

Figure 15:
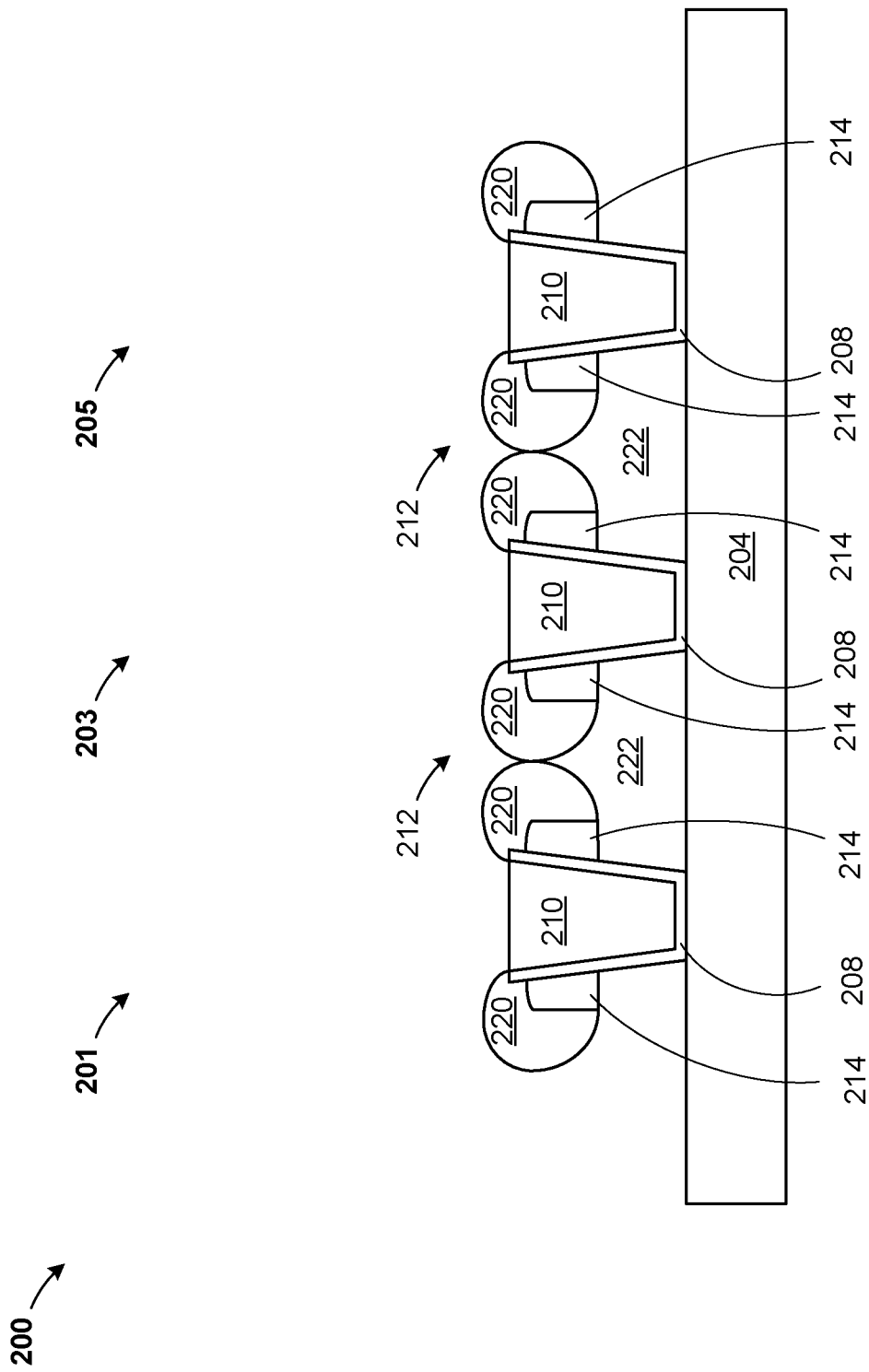
FIG. 15 illustrates removal of the second sacrificial material, according to an exemplary embodiment.

Referring now to FIG. 15, the structure 200 is shown according to an exemplary embodiment. The second sacrificial layer 218 may be removed.

The second sacrificial layer 218 may be removed selective to the dielectric 220, the BEOL metal layer 210, the thin metal liner 208, the conformal dielectric 214 and the BEOL dielectric layer 204. The air gap 222 may be increased by the removal of the second sacrificial layer 218. The dielectric 220 and the conformal dielectric 214 may form an upper horizontal surface of the air gap 222. The thin metal liner 208 may provide vertical side boundaries of the air gap 222. The BEOL dielectric layer 204 may provide a lower horizontal boundary of the air gap 222.

Figure 16:
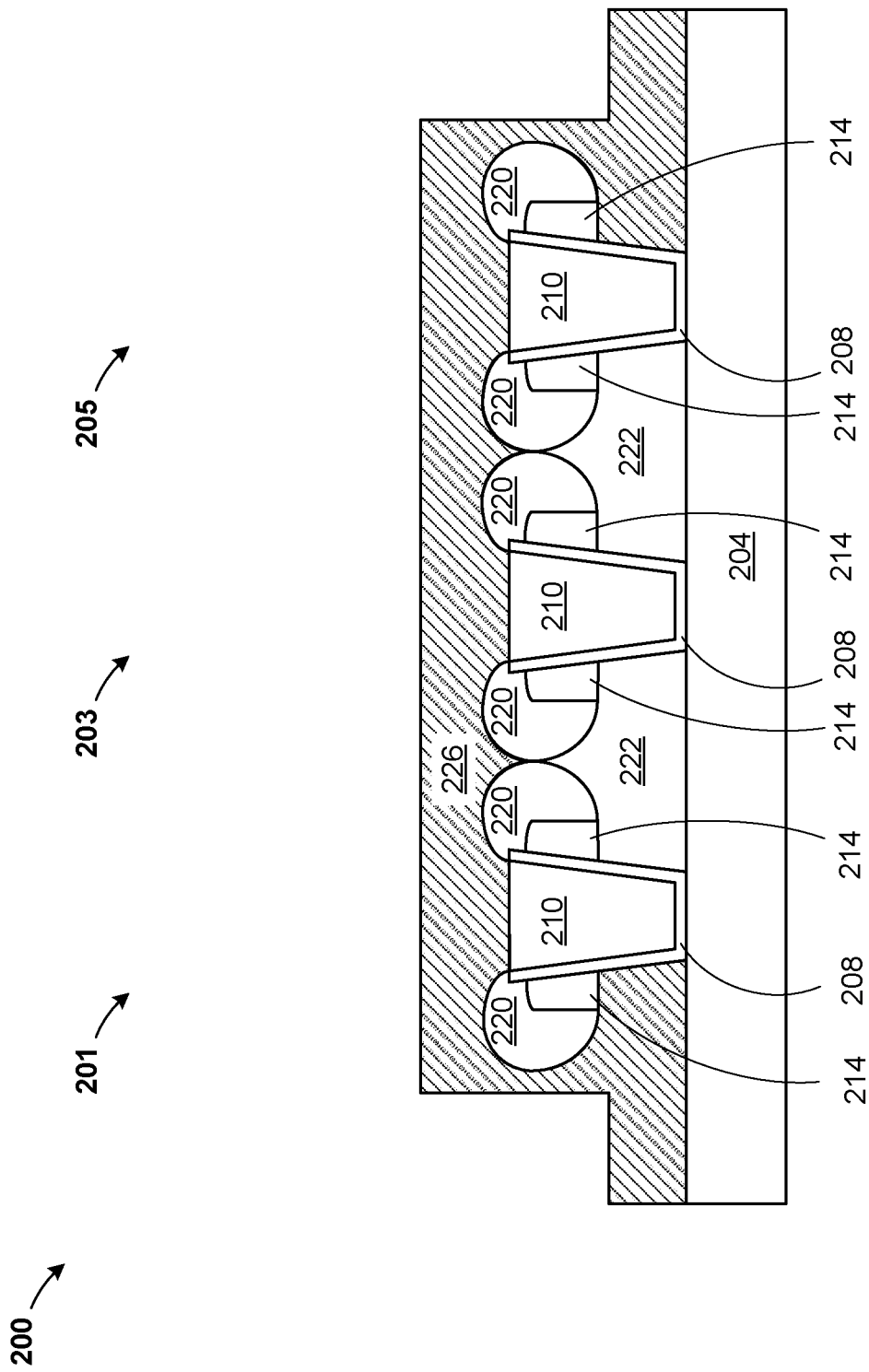
FIG. 16 illustrates deposition of a second dielectric, according to an exemplary embodiment.

Referring now to FIG. 16, the structure 200 is shown according to an exemplary embodiment. A dielectric cap 226 may be formed.

The dielectric cap 226 may be formed by depositing or growing a dielectric material on the dielectric 220, the BEOL metal layer 210, the thin metal liner 208 and the BEOL dielectric layer 204. The dielectric cap 226 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the dielectric cap 226 may include one or more layers. In an embodiment, the dielectric cap 226 may include any dielectric material such as tetraethyl orthosilicate (TEOS), silicon oxide (SiOx), silicon nitride (SiNx), silicon boron carbonitride (SiBCN), SiCN, SiCNO, Metal Oxide-SiCO composited cap, MnSiOx, a low-k dielectric material (with k<4.0), including but not limited to, silicon oxide, spin-on-glass, a flowable oxide, a high-density plasma oxide, borophosphosilicate glass (BPSG), or any combination thereof or any other suitable dielectric material.

The air gap 222 may remain between the signal lines 201, 203 and between the signal lines 203, 205, as the air gap 222 is surrounded by the dielectric 220, the conformal dielectric 214 and the BEOL dielectric layer 204.

Figure 17:
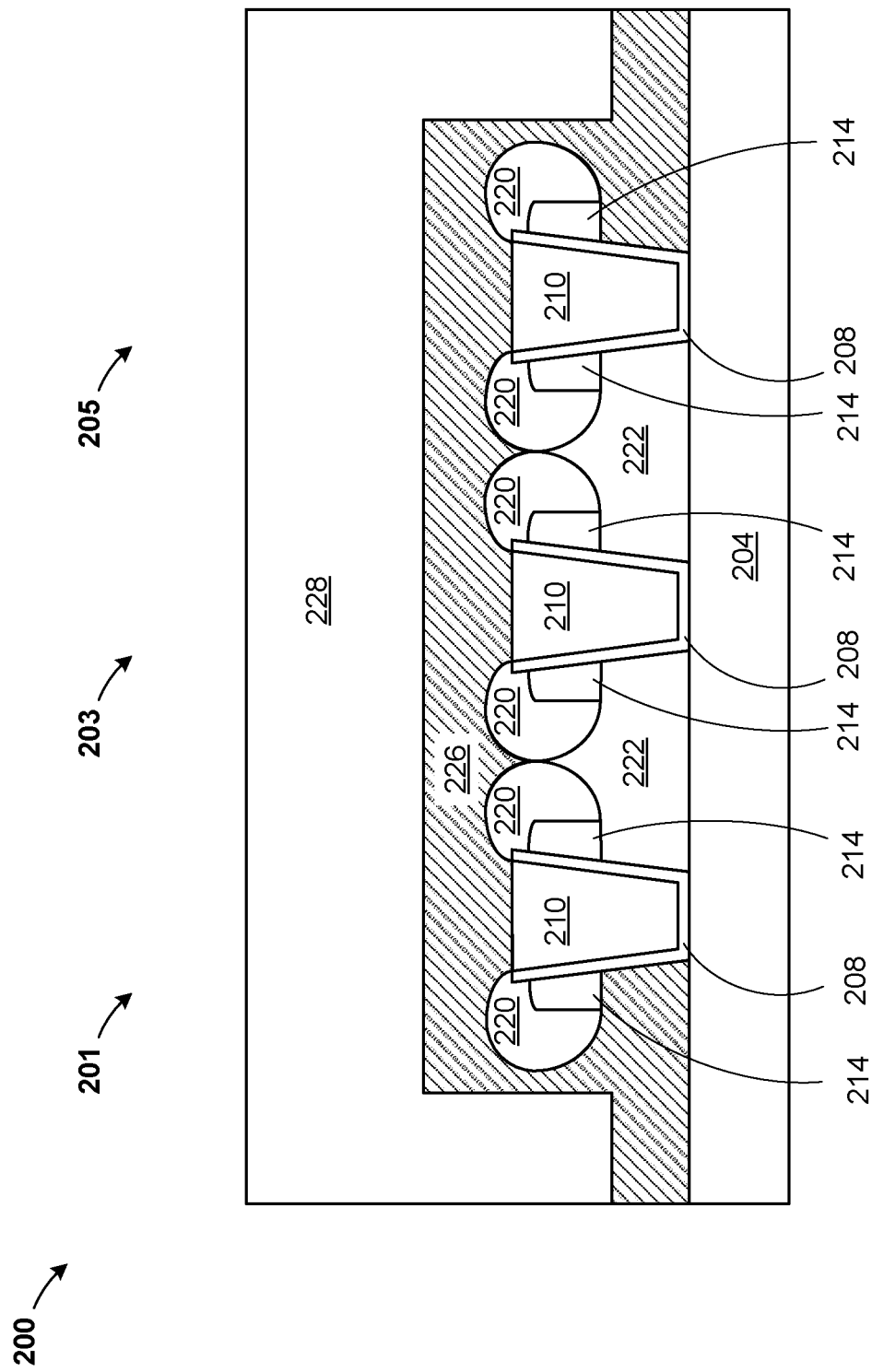
FIG. 17 illustrates deposition of an interlayer dielectric, according to an exemplary embodiment.

Referring now to FIG. 17, the structure 200 is shown according to an exemplary embodiment. A second BEOL dielectric layer 228 may be formed.

The second BEOL dielectric layer 228 may be formed by depositing or growing a dielectric material on the dielectric cap 226, followed by a chemical mechanical polishing (CMP) or etch steps. The second BEOL dielectric layer 228 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the second BEOL dielectric layer 228 may include one or more layers. In an embodiment, the second BEOL dielectric layer 228 may include any dielectric material such as tetraethyl orthosilicate (TEOS), silicon oxide (SiOx), silicon nitride (SiNx), silicon boron carbonitride (SiBCN), SiCN, SICNO, SiCO, a low-k dielectric material (with k<4.0), including but not limited to, silicon oxide, spin-on-glass, a flowable oxide, a high-density plasma oxide, borophosphosilicate glass (BPSG), or any combination thereof or any other suitable dielectric material.

The structure 200 may be subjected to, for example, CMP to planarize the surface for further processing, such that upper horizontal surfaces of second BEOL dielectric layer 228 is coplanar.

Figure 18:
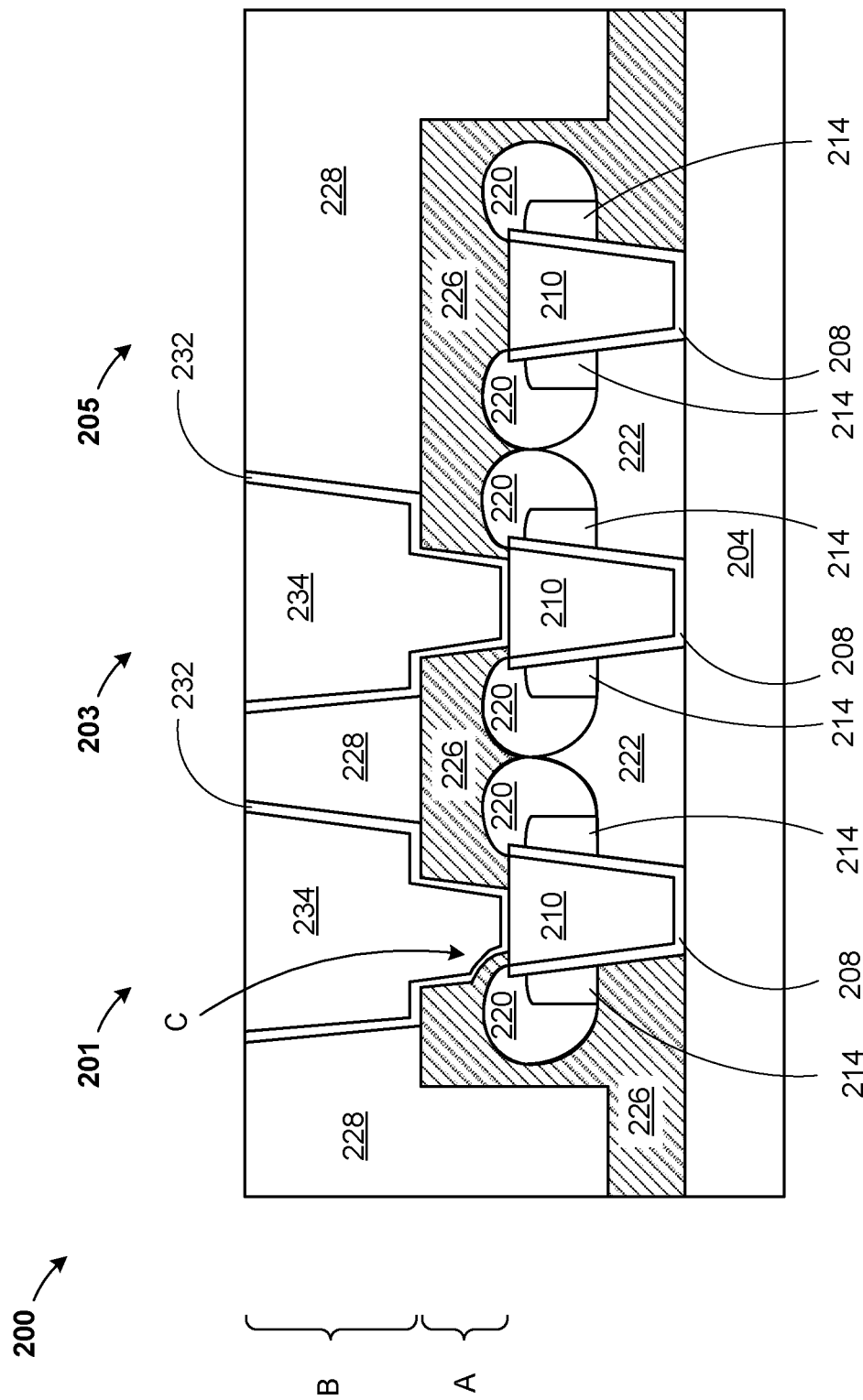
FIG. 18 illustrate formation of a via and a metal line, according to an exemplary embodiment.

Referring now to FIG. 18, the structure 200 is shown according to an exemplary embodiment. A second BEOL metal layer 234 may be formed.

The second BEOL metal layer 234 may include a via portion A and a metal line portion B. The second BEOL metal layer 234 may be formed by methods known in the arts and include several steps. The second BEOL metal layer 234 may be formed by a damascene process with metal such as copper (Cu), cobalt (Co), ruthenium (Ru), tungsten (W), molybdenum (Mo), or a combination thereof, followed by CMP. Damascene process is a conventional metallization process which trenches are formed first in the second BEOL dielectric layer 228 and a via is formed in the dielectric cap 226, followed by metal deposition and CMP. The second BEOL metal layer 234 can be formed by for example, chemical vapor deposition (CVD), physical vapor deposition (PVD), and atomic layer deposition (ALD) or a combination thereof.

In an embodiment, a thin metal liner 232 such as tantalum (Ta), titanium (Ti), titanium nitride (TiN), ruthenium (Ru), or a combination thereof, may be deposited prior to bulk metal fill. The portion B of the second BEOL metal layer 234 is a signal line. The portion A of the second BEOL metal layer 234 is a via. FIG. 18 illustrates two signal lines of the portion B of the second BEOL metal layer 234, however there may be any number of signal lines in the structure 200, each of which may connect to a BEOL metal layer 210.

A planarization process, such as, for example, chemical mechanical polishing (CMP), may be done to remove excess material from a top surface of the second BEOL dielectric layer 128, the thin metal liner 132 and the second BEOL metal layer 134, such that upper horizontal surfaces are coplanar.

The formation of the via portion A and the metal line portion B of the second BEOL metal layer 234 is self-aligning. Referring to the point C of the FIG. 18, as shown, when the opening (not shown) for the via portion A of the second BEOL metal layer 234 is formed, the opening may not be centered over the BEOL metal layer 210. The material of the dielectric 220 prevents over etching of the opening (not shown), allowing for self-alignment of the opening (not shown) for the BEOL metal layer 210.

The structure 200 illustrates a BEOL interconnect structure with an air gap 222, which provides increased thermal isolation of between adjacent signal lines 201, 203, 205, and reducing capacitance of the signal lines 201, 203, 205.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
   a first back end of line (BEOL) layer, the first BEOL layer comprising a first signal line and a second signal line; and
   a conformal dielectric surrounding vertical sidewalls of each of the first signal line and the second signal line;
   an air gap between the first signal line and the second signal line,
   wherein a vertical side boundary of the air gap is a vertical side surface of the conformal dielectric.

2. The semiconductor device according to claim 1, further comprising:
   wherein a lower horizontal boundary of the air gap is a BEOL dielectric layer below the first BEOL layer.

3. The semiconductor device according to claim 1, wherein
   an upper horizontal boundary of the air gap is a second dielectric selectively grown from the conformal dielectric.

4. The semiconductor device according to claim 3, wherein
   the second dielectric selectively grown from the conformal dielectric meet between the first signal line and the second signal line.

5. The semiconductor device according to claim 1, further comprising:
   a thin metal liner surrounding a lower horizontal surface and vertical side surfaces of the first signal line and the second signal line.

6. The semiconductor device according to claim 4, wherein
   an upper horizontal surface of the conformal dielectric is a lower horizontal surface of a second dielectric selectively grown from the conformal dielectric.

7. A semiconductor device comprising:
   a first back end of line (BEOL) layer, the first BEOL layer comprising a first signal line and a second signal line;
   a conformal dielectric surrounding an upper portion of a vertical sidewall of each of the first signal line and the second signal line; and
   an air gap between the first signal line and the second signal line,
   wherein a vertical side boundary of the air gap is a vertical side surface of the first signal line.

8. The semiconductor device according to claim 7, wherein
   a lower horizontal boundary of the air gap is a BEOL dielectric layer below the first BEOL layer.

9. The semiconductor device according to claim 7, wherein
   an upper horizontal boundary of the air gap is a second dielectric grown from the conformal dielectric.

10. The semiconductor device according to claim 9, wherein
    the second dielectric grown from the conformal dielectric meet between the first signal line and the second signal line.

11. The semiconductor device according to claim 7, further comprising:
    a thin metal liner surrounding a lower horizontal surface and vertical side surfaces of the first signal line and the second signal line.

12. The semiconductor device according to claim 7, wherein
    a vertical side surface of the conformal dielectric is a vertical side surface of a second dielectric grown from the conformal dielectric.

13. A method comprising:
    forming a first metal line and a second metal line in a sacrificial material in a first back end of line (BEOL) layer;
    removing the sacrificial material;
    forming a conformal dielectric surrounding vertical side surfaces of the first metal line and the second metal line,
    wherein an air gap between the first metal line and the second metal line exposes an upper horizontal surface of a dielectric layer below the first BEOL layer; and
    growing a dielectric selectively from an upper portion of the conformal dielectric, wherein
    the air gap remains between the first metal line and the second metal line.

14. The method according to claim 13, further comprising:
    forming a second sacrificial material between the first metal line and the second metal line in the gap.

15. The method according to claim 14, further comprising:
    removing the second sacrificial material.

16. The method according to claim 13, wherein
    a vertical side boundary of the air gap is a vertical side surface of the conformal dielectric.

17. The method according to claim 13, further comprising:
    a thin metal liner surrounding a lower horizontal surface and vertical side surfaces of the first signal line and the second signal line.

18. The method according to claim 13, further comprising:
    an upper horizontal boundary of the air gap is a second dielectric grown from the conformal dielectric.

19. The method according to claim 18, further comprising:

the second dielectric selectively grown from the conformal dielectric meet between the first signal line and the second signal line.

20. The method according to claim 13, wherein an upper horizontal surface of the conformal dielectric is a lower horizontal surface of a second dielectric grown from the conformal dielectric.

* * * * *